(12) United States Patent
Adachi

(10) Patent No.: US 12,107,161 B2
(45) Date of Patent: Oct. 1, 2024

(54) SEMICONDUCTOR DEVICE

(71) Applicant: ROHM CO., LTD., Kyoto (JP)

(72) Inventor: Kosaku Adachi, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 0 days.

(21) Appl. No.: 17/893,543

(22) Filed: Aug. 23, 2022

(65) Prior Publication Data

US 2023/0060885 A1 Mar. 2, 2023

(30) Foreign Application Priority Data

Aug. 26, 2021 (JP) .................................. 2021-138392

(51) Int. Cl.
*H01L 29/78* (2006.01)
*H01L 21/763* (2006.01)
*H01L 29/66* (2006.01)

(52) U.S. Cl.
CPC ........ *H01L 29/7818* (2013.01); *H01L 21/763* (2013.01); *H01L 29/66681* (2013.01)

(58) Field of Classification Search
CPC .................................................. H01L 29/7818
See application file for complete search history.

(56) References Cited

U.S. PATENT DOCUMENTS

| | | | | |
|---|---|---|---|---|
| 4,583,282 A * | 4/1986 | Hulseweh | ............. | H01L 21/033 257/E21.537 |
| 6,566,708 B1 * | 5/2003 | Grover | ................ | H01L 29/7397 257/302 |
| 7,489,011 B2 * | 2/2009 | Yilmaz | ............. | H01L 29/66727 257/E29.313 |
| 8,362,550 B2 * | 1/2013 | Rexer | ................. | H01L 29/7811 438/270 |
| 11,764,209 B2 * | 9/2023 | Sdrulla | ........... | H01L 21/823814 257/665 |
| 2002/0190282 A1 * | 12/2002 | Calafut | ............... | H01L 29/7802 257/E29.152 |
| 2006/0258081 A1 * | 11/2006 | Kocon | .................. | H01L 29/861 438/237 |
| 2008/0061364 A1 * | 3/2008 | Sim | ..................... | H01L 29/4983 438/270 |
| 2008/0135931 A1 * | 6/2008 | Challa | ................. | H01L 29/0634 257/E29.066 |
| 2016/0163583 A1 * | 6/2016 | Liu | ................... | H01L 29/66681 438/430 |

(Continued)

FOREIGN PATENT DOCUMENTS

JP 2015-122543 A 7/2015

*Primary Examiner* — Eugene Lee
(74) *Attorney, Agent, or Firm* — Rabin & Berdo, P.C.

(57) ABSTRACT

A semiconductor device includes: a chip having a first main surface on one side and a second main surface on the other side; a first region of a first conduction type which is formed on the second main surface side in the chip; a second region of a second conduction type which is formed on the first main surface side of the chip and forms a pn-junction portion with the first region; a device region which is provided on the first main surface; a first groove structure including a first groove, a first insulating film, and a first polysilicon, and partitioning the device region; and a second groove structure including a second groove, a second insulating film, and a second polysilicon, and partitioning the device region on a device region side of the first groove structure.

17 Claims, 26 Drawing Sheets

(56) References Cited

U.S. PATENT DOCUMENTS

| | | | |
|---|---|---|---|
| 2017/0278837 A1* | 9/2017 | Hsieh | H01L 29/7805 |
| 2018/0053765 A1* | 2/2018 | Pendharkar | H01L 21/765 |
| 2020/0303507 A1* | 9/2020 | Yilmaz | H01L 29/4236 |
| 2023/0352545 A1* | 11/2023 | Wada | H01L 29/0878 |

* cited by examiner

FIG. 8

SEMICONDUCTOR DEVICE

CROSS-REFERENCE TO RELATED APPLICATION

This application is based upon and claims the benefit of priority from Japanese Patent Application No. 2021-138392, filed on Aug. 26, 2021, the entire contents of which are incorporated herein by reference.

TECHNICAL FIELD

The present disclosure relates to a semiconductor device.

BACKGROUND

In the related art, a semiconductor device, which includes a p-type region, a first p-type epitaxial region, an n-type buried region, a second p-type epitaxial region, and a DTI (Deep Trench Isolation) structure, has been disclosed. The first p-type epitaxial region is formed on the p-type region. The n-type buried region is formed on the first p-type epitaxial region. The second p-type epitaxial region is formed on the n-type buried region. The DTI structure surrounds a formation region of a high-withstand voltage horizontal MOS transistor in a plan view. The DTI structure penetrates the second p-type epitaxial region, the n-type buried region, and the first p-type epitaxial region so as to reach the p-type region.

SUMMARY

Some embodiments of the present disclosure provide a semiconductor device capable of improving a withstand voltage.

According to one embodiment of the present disclosure, a semiconductor device includes: a chip having a first main surface on one side and a second main surface on the other side; a first region of a first conduction type which is formed on the second main surface side in the chip; a second region of a second conduction type which is formed on the first main surface side of the chip and forms a pn-junction portion with the first region; a device region which is provided on the first main surface; a first groove structure including a first groove which penetrates the pn-junction portion from the first main surface, a first insulating film which exposes the first region from a wall surface of the first groove, and a first polysilicon which is buried in the first groove with the first insulating film interposed between the first groove and the first polysilicon, and partitioning the device region; and a second groove structure including a second groove which penetrates the pn-junction portion from the first main surface, a second insulating film which exposes the first region from a wall surface of the second groove, and a second polysilicon which is buried in the second groove with the second insulating film interposed between the second groove and the second polysilicon, and partitioning the device region on a device region side of the first groove structure.

According to another embodiment of the present disclosure, a semiconductor device includes: a chip having a main surface; a first pn-junction portion which is formed inside the chip so as to extend along the main surface; a device region which is provided on the main surface; a groove structure including a groove which penetrates the first pn-junction portion from the main surface, an insulating film which exposes the bottom wall of the groove in the groove, and a polysilicon which is buried in the groove with the insulating film interposed between the groove and the polysilicon, and partitioning the device region from other regions; and a second pn-junction portion which is formed inside the polysilicon.

The above or other objects, features, and effects are manifested by embodiments described by reference to the accompanying drawings.

BRIEF DESCRIPTION OF DRAWINGS

FIG. 8 is a cross-sectional view showing a semiconductor device according to a second embodiment.

DETAILED DESCRIPTION

Figure 1:
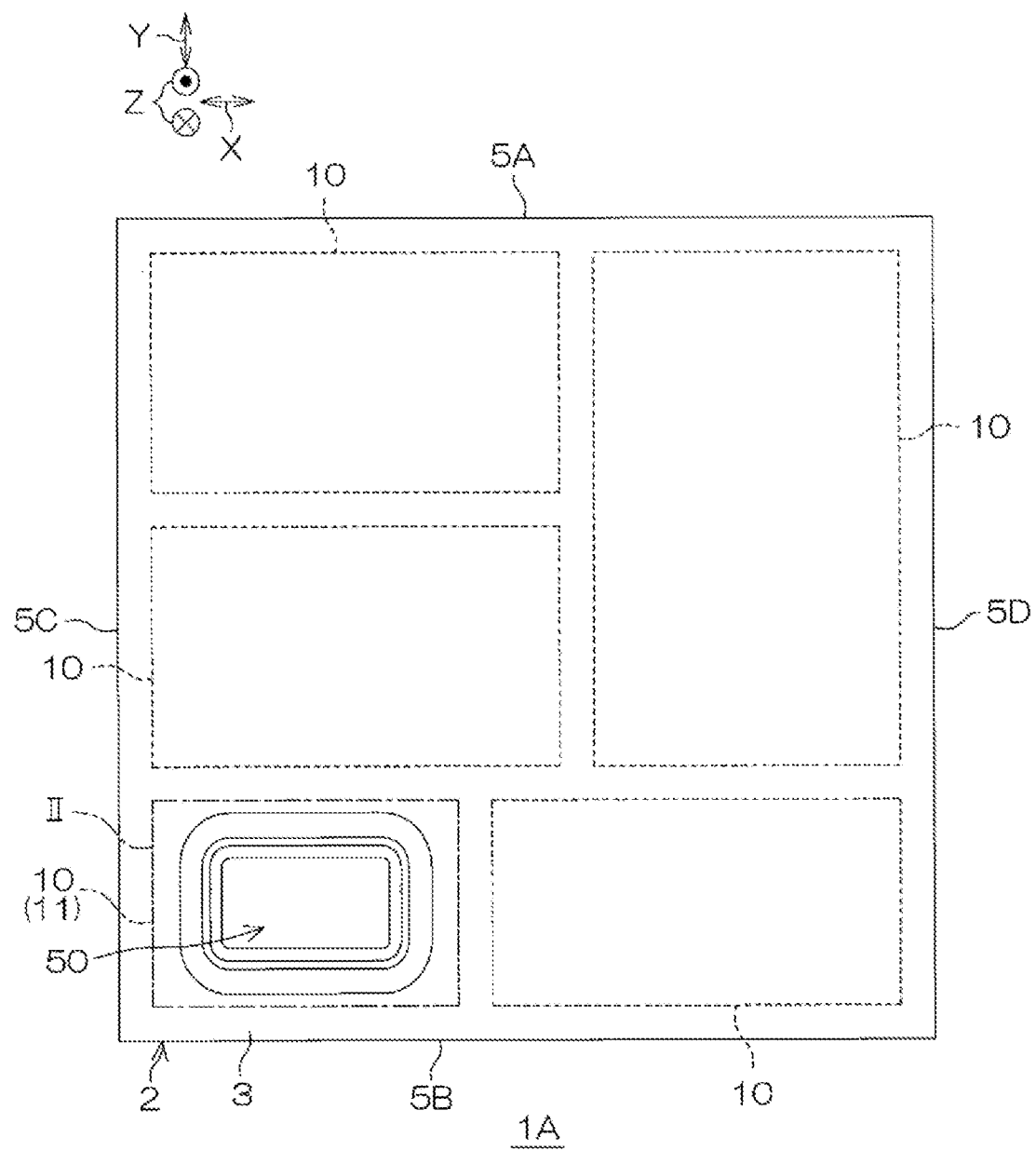
FIG. 1 is a plan view showing a semiconductor device according to a first embodiment.

Embodiments will be now described in detail with reference to the accompanying drawings. The accompanying drawings are schematic views and are not exactly illustrated, and the scales thereof and the like do not always match. In addition, the structures corresponding between the accompanying drawings are denoted by the same reference numerals, and description thereof is omitted or simplified. The description given before the omission or simplification applies to the structures whose description is omitted or simplified.

Figure 2:
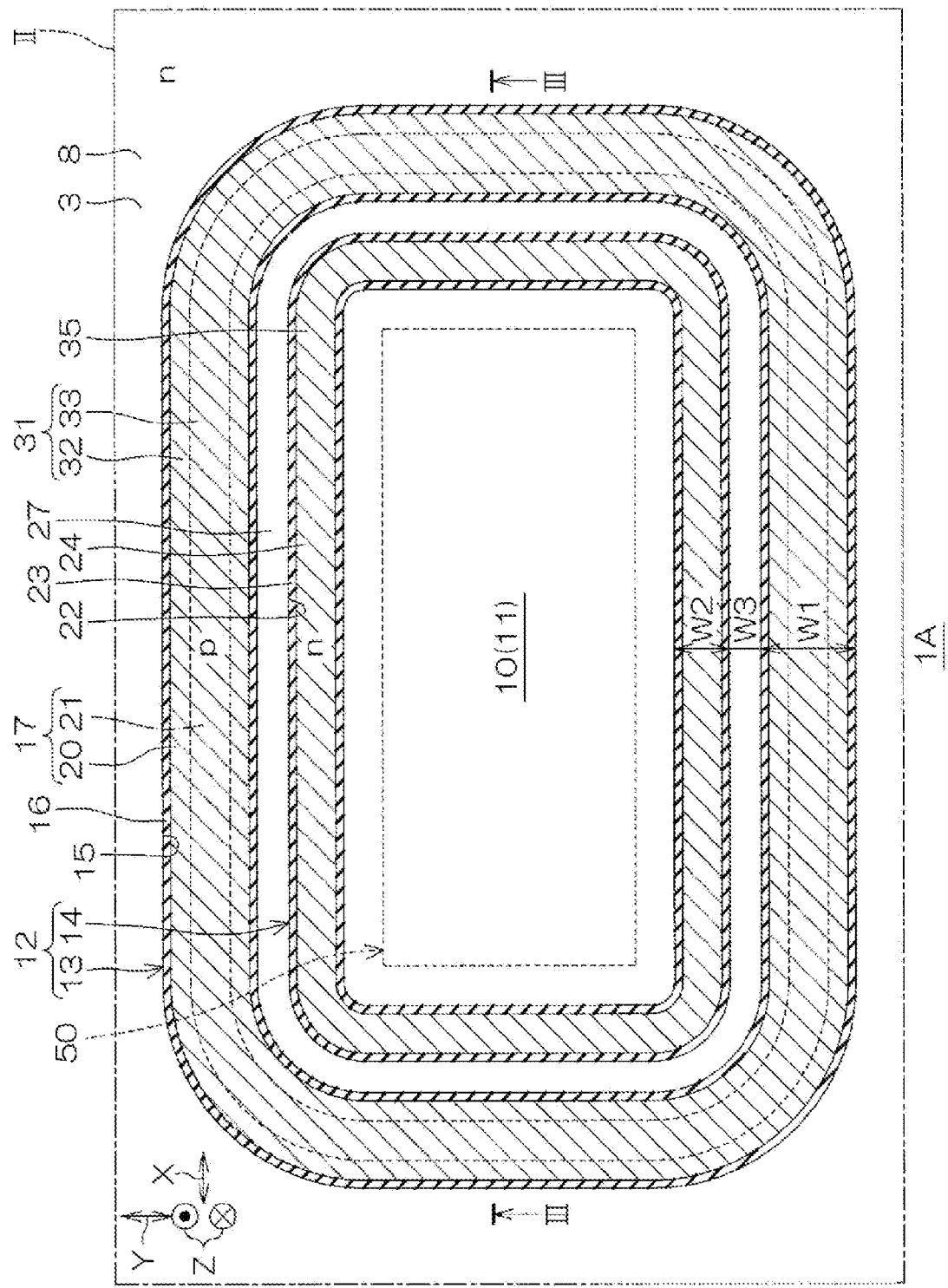
FIG. 2 is an enlarged view of region II shown in FIG. 1.
Figure 3:
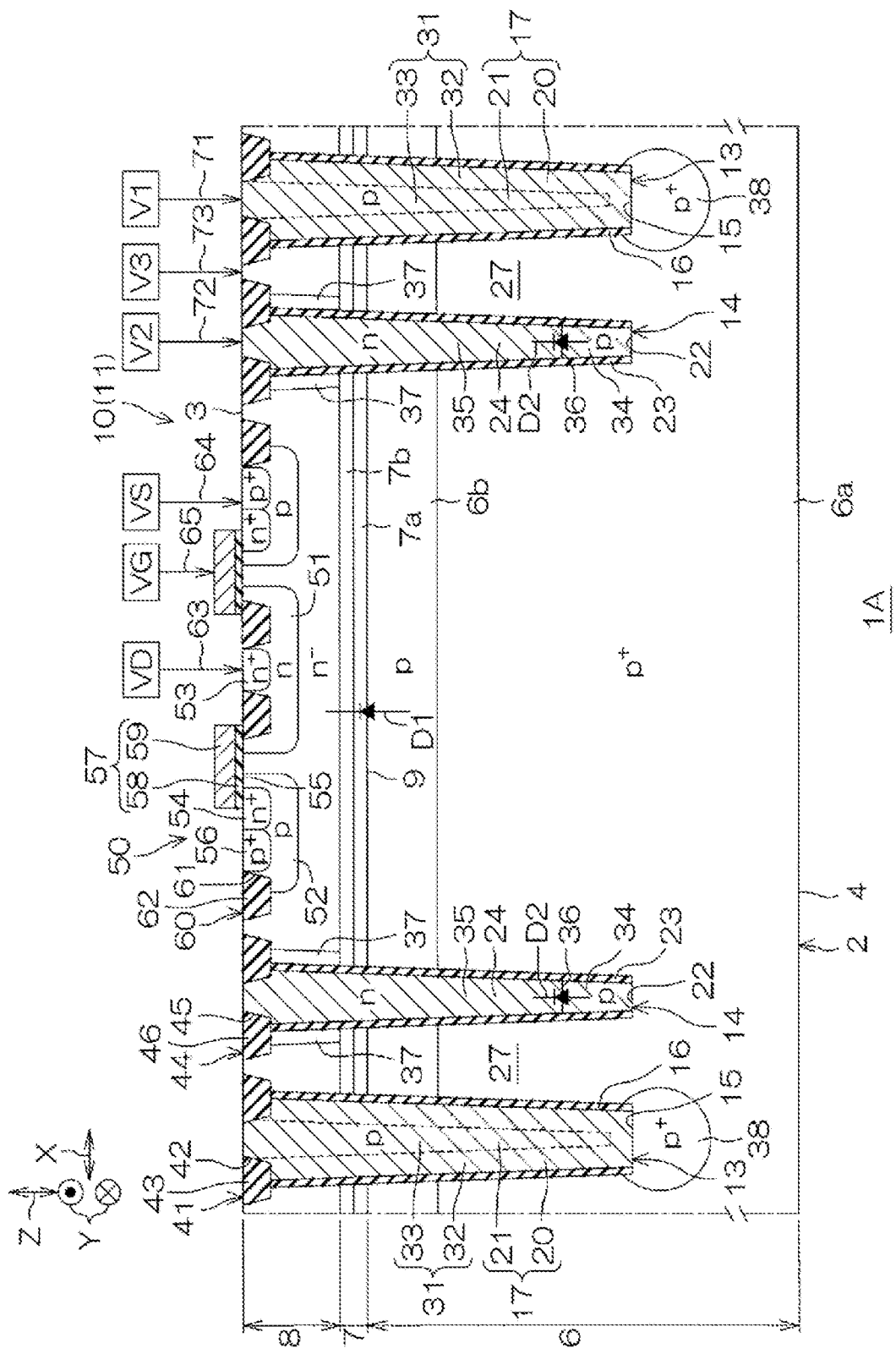
FIG. 3 is a cross-sectional view taken along line III-III shown in FIG. 2.
Figure 4:
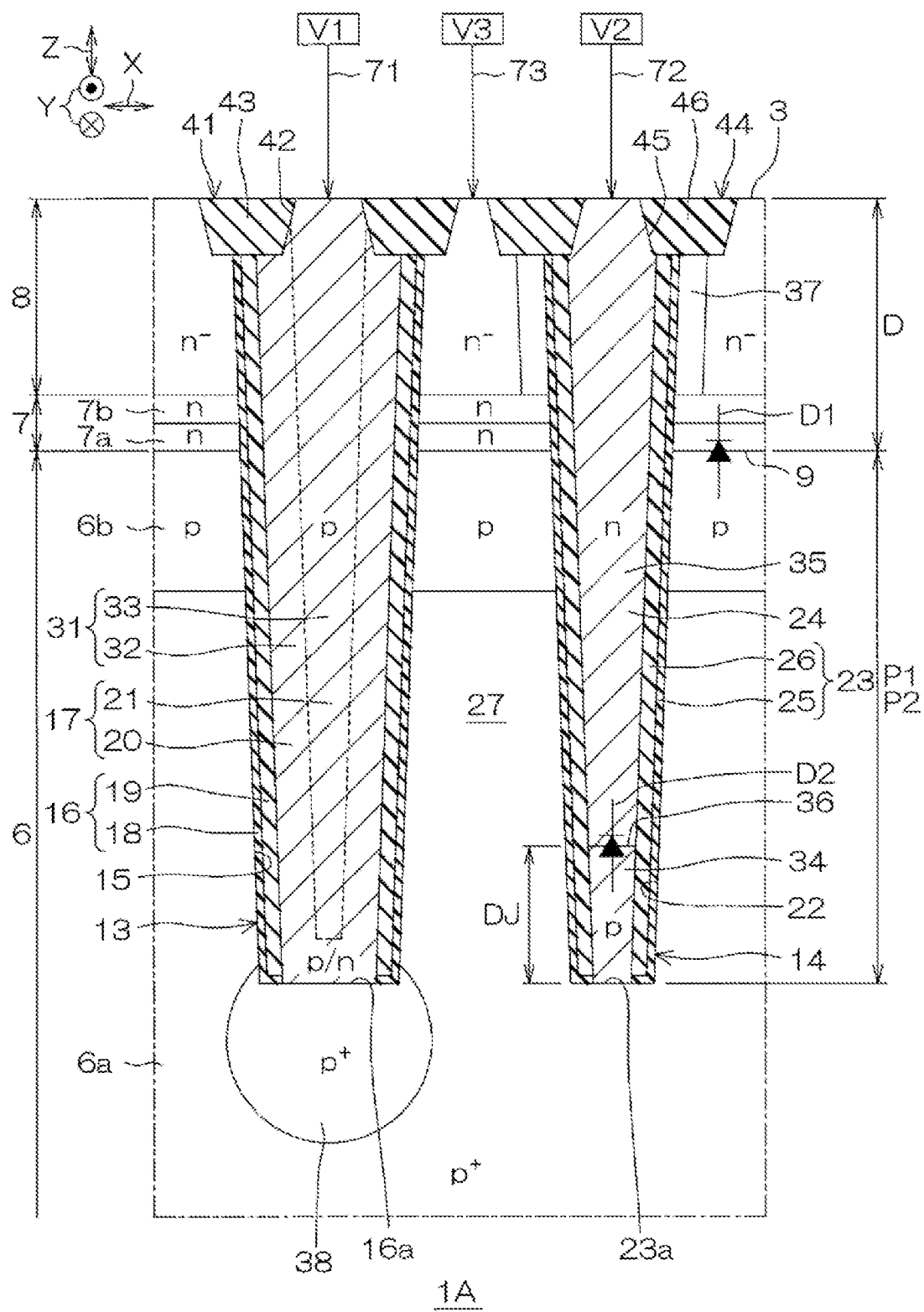
FIG. 4 is an enlarged cross-sectional view of a main part of a structure shown in FIG. 3.

FIG. 1 is a plan view showing a semiconductor device 1A according to a first embodiment. FIG. 2 is an enlarged view of a region II shown in FIG. 1. FIG. 3 is a cross-sectional view taken along line III-III shown in FIG. 2. FIG. 4 is an enlarged cross-sectional view of a main part of a structure shown in FIG. 3. Referring to FIGS. 1 to 4, the semiconductor device 1A includes a rectangular parallelepiped chip 2 (semiconductor chip). In this embodiment, the chip 2 is formed of a Si (silicon) chip. The chip 2 has a first main surface 3 on one side, a second main surface 4 on the other side, and first to fourth side surfaces 5A to 5D which are connected to the first main surface 3 and the second main surface 4.

The first main surface 3 and the second main surface 4 are formed in a square shape in a plan view viewed from their normal direction Z (hereinafter, simply referred to as a "plan view"). The normal direction Z is also a thickness direction of the chip 2. The first side surface 5A and the second side surface 5B extend in a first direction X along the first main surface 3 and face a second direction Y which intersects (specifically, is orthogonal to) the first direction X. The third side surface 5C and the fourth side surface 5D extend in the second direction Y and face the first direction X.

The semiconductor device 1A includes a p-type (first conduction type) first region 6 formed in a region on the second main surface 4 side in the chip 2. The first region 6 may be referred to as a "base region." The first region 6 may be regarded as a constituent element of the chip 2. The first region 6 extends in a layer shape along the second main surface 4 and is exposed from portions of the second main surface 4 and the first to fourth side surfaces 5A to 5D. The first region 6 has a concentration gradient in which a p-type impurity concentration on the first main surface 3 side is lower than a p-type impurity concentration on the second main surface 4 side. Specifically, the first region 6 has a laminated structure including a p-type first high-concentration region 6a and a p-type first low-concentration region 6b, which are stacked in this order from the second main surface 4 side.

The first high-concentration region 6a has a relatively high p-type impurity concentration. The p-type impurity concentration of the first high-concentration region 6a may be $1\times10^{17}$ cm$^{-3}$ or more and $1\times10^{20}$ cm$^{-3}$ or less. The first high-concentration region 6a may contain boron (B) as a p-type impurity. The first high-concentration region 6a may have a thickness of 50 μm or more and 500 μm or less. In this embodiment, the first high-concentration region 6a is formed of a p-type semiconductor substrate (Si substrate).

The first low-concentration region 6b has a p-type impurity concentration lower than that of the first high-concentration region 6a and is stacked on the first high-concentration region 6a. The p-type impurity concentration of the first low-concentration region 6b may be $1\times10^{14}$ cm$^{-3}$ or more and $1\times10^{17}$ cm$^{-3}$ or less. The first low-concentration region 6b may contain boron (B) as a p-type impurity. The first low-concentration region 6b has a thickness less than a thickness of the first high-concentration region 6a. The thickness of the first low-concentration region 6b may be 1 μm or more and 20 μm or less. In this embodiment, the first low-concentration region 6b is formed of a p-type epitaxial layer (Si epitaxial layer).

The semiconductor device 1A includes an n-type (second conduction type) second region 7 formed in a region on the first main surface 3 side in the chip 2. The second region 7 may be referred to as a "buried region." The second region 7 may be regarded as a constituent element of the chip 2. The second region 7 is stacked on the first region 6 and is electrically connected to the first region 6. The second region 7 extends in a layer shape along the first region 6 and is exposed from portions of the first to fourth side surfaces 5A to 5D. The second region 7 has a concentration gradient in which an n-type impurity concentration on the first main surface 3 side is higher than an n-type impurity concentration on the second main surface 4 side. Specifically, the second region 7 has a stacked structure including a second low-concentration region 7a and a second high-concentration region 7b, which are stacked in this order from the first region 6 side.

The second low-concentration region 7a has a relatively low n-type impurity concentration and is stacked on the first low-concentration region 6b of the first region 6. The n-type impurity concentration of the second low-concentration region 7a may be $1\times10^{14}$ cm$^{-3}$ or more and $1\times10^{18}$ cm$^{-3}$ or less. The second low-concentration region 7a may have a thickness of 0.1 μm or more and 5 μm or less. It is desirable that the thickness of the second low-concentration region 7a is 0.5 μm or more and 2.5 μm or less. In this embodiment, the second low-concentration region 7a is formed of an n-type epitaxial layer (Si epitaxial layer).

The second high-concentration region 7b has an n-type impurity concentration higher than that of the second low-concentration region 7a and is stacked on the second low-concentration region 7a. The n-type impurity concentration of the second high-concentration region 7b may be $1\times10^{16}$ cm$^{-3}$ or more and $1\times10^{21}$ cm$^{-3}$ or less. The second high-concentration region 7b may have a thickness of 0.1 μm or more and 5 μm or less. It is desirable that the thickness of the second high-concentration region 7b is 0.5 μm or more and 2.5 μm or less. In this embodiment, the second high-concentration region 7b is formed of an n-type epitaxial layer (Si epitaxial layer).

The semiconductor device 1A includes a p-type or n-type third region 8 formed in a region on the first main surface 3 side in the chip 2. The third region 8 may be referred to as a "drift region." The third region 8 may be regarded as a constituent element of the chip 2. The third region 8 is formed in a region on the first main surface 3 side with respect to the second region 7. The conduction type (p-type or n-type) of the third region 8 is arbitrary and is selected according to the specification of the semiconductor device 1A. In this embodiment, an example in which the third region 8 is an n-type is described, but it is not intended to limit the conduction type of the third region 8 to the n-type.

The third region 8 is stacked on the second region 7 and is electrically connected to the second region 7. The third region 8 extends in a layer shape along the second region 7 and is exposed from portions of the first main surface 3 and the first to fourth side surfaces 5A to 5D. The third region 8 may have a uniform n-type impurity concentration in the thickness direction, or may have a concentration gradient in which the n-type impurity concentration increases toward the first main surface 3.

It is desirable that the n-type impurity concentration of the third region 8 has an n-type impurity concentration lower than that in the second region 7 (the second high-concentration region 7b). The n-type impurity concentration of the third region 8 may be $1\times10^{14}$ cm$^{-3}$ or more and $1\times10^{17}$ cm$^{-3}$ or less. The third region 8 may have a thickness of 5 μm or more and 30 μm or less. In this embodiment, the third region 8 is formed of an n-type epitaxial layer (Si epitaxial layer).

The semiconductor device 1A includes a first pn-junction portion 9 formed in the middle of the chip 2 between the first main surface 3 and the second main surface 4 in the thickness direction. The first pn-junction portion 9 may be considered as a constituent element of the chip 2. The first pn-junction portion 9 may be referred to as a "first pn-connection portion" or a "first pn-boundary portion." The first pn-junction portion 9 extends in the horizontal direction (the direction orthogonal to the thickness direction) along the first main surface 3.

The first pn-junction portion 9 is formed at a boundary between the first region 6 (the first low-concentration region 6b) and the second region 7 (the second low-concentration region 7a). That is, the second region 7 is stacked on the first region 6 so as to form the first pn-junction portion 9 with the first region 6. As a result, the semiconductor device 1A includes a first diode D1 having the first region 6 as an anode and the second region 7 as a cathode between the first region 6 and the second region 7.

The semiconductor device 1A includes a plurality of device regions 10 installed on the first main surface 3. The plurality of device regions 10 is regions in which various functional devices are formed by utilizing the regions inside and outside the chip 2. The plurality of device regions 10 is partitioned in the inner portion of the first main surface 3 at intervals from the first to fourth side surfaces 5A to 5D in a plan view. The number, arrangement, and shape of the device regions 10 are arbitrary and are not limited to a particular number, arrangement, and shape.

Each of the plurality of functional devices may include at least one selected from the group of a semiconductor switching device, a semiconductor rectifying device, and a passive device. The semiconductor switching device may include at least one selected from the group of JFET (Junction Field Effect Transistor), MISFET (Metal Insulator Semiconductor Field Effect Transistor), BJT (Bipolar Junction Transistor), and IGBT (Insulated Gate Bipolar Junction Transistor).

The semiconductor rectifying device may include at least one selected from the group of a pn-junction diode, a pin-junction diode, a Zener diode, a Schottky barrier diode, and a fast recovery diode. The passive device may include at least one selected from the group of a resistor, a capacitor, an inductor, and a fuse. In this embodiment, the plurality of device regions 10 includes at least one transistor region 11. Hereinafter, the structure of the transistor region 11 side will be specifically described.

Referring to FIGS. 2 to 4, the semiconductor device 1A includes a trench separation structure 12 (groove structure) as an example of a region separation structure for partitioning the transistor region 11 on the first main surface 3. The trench separation structure 12 has a multi-trench structure including at least one first trench structure 13 (first groove structure) and at least one second trench structure 14 (second groove structure). In this embodiment, the trench separation structure 12 has a double trench structure including a single first trench structure 13 and a single second trench structure 14.

Referring to FIG. 2, the first trench structure 13 is formed on the first main surface 3 so as to partition the transistor region 11. In this embodiment, the first trench structure 13 is formed in an annular shape (square annular shape in this embodiment) in a plan view and partitions the transistor region 11 of a predetermined shape (square shape in this embodiment). In this embodiment, the first trench structure 13 has corner portions (four corners) curved in an arc shape in a plan view. The planar shape of the first trench structure 13 (the planar shape of the transistor region 11) is arbitrary. The first trench structure 13 may be formed in a polygonal annular shape, a circular annular shape, or an elliptical annular shape in a plan view, and may partition the transistor region 11 of a polygonal shape, a circular shape, or an elliptical shape in a plan view.

The first trench structure 13 has a first width W1. The first width W1 is a width (maximum value) in a direction orthogonal to the direction in which the first trench structure 13 extends in a plan view. The first width W1 may be 0.5 μm or more and 10 μm or less. It is desirable that the first width W1 is 2 μm or more and 4 μm or less.

Referring to FIGS. 3 and 4, the first trench structure 13 is formed on the first main surface 3 so as to penetrate the first pn-junction portion 9. Specifically, the first trench structure 13 penetrates the third region 8 and the second region 7 so as to reach the first region 6, and partitions the transistor region 11 in the third region 8. More specifically, the first trench structure 13 extends from the first main surface 3 toward the second main surface 4 side so as to reach the first high-concentration region 6a of the first region 6, and penetrates the third region 8, the second region 7, and the first low-concentration region 6b of the first region 6.

The first trench structure 13 includes an inner peripheral wall on the transistor region 11 side, an outer peripheral wall on the opposite side of the inner peripheral wall (the peripheral side of the chip 2), and a bottom wall which connects the inner peripheral wall and the outer peripheral wall. The first trench structure 13 may be formed in a vertical shape in a cross-sectional view. The first trench structure 13 may be formed in a tapered shape toward the second main surface 4 side in a cross-sectional view. The bottom wall of the first trench structure 13 may be formed in a curved shape toward the second main surface 4. The bottom wall of the first trench structure 13 may have a flat surface parallel to the first main surface 3.

The first trench structure 13 protrudes from the first pn-junction portion 9 toward the second main surface 4 side by a first protrusion amount P1. The first protrusion amount P1 may be 1 μm or more and 30 μm or less. It is desirable that the first protrusion amount P1 is 5 μm or more and 25 μm or less. It is particularly desirable that the first protrusion amount P1 is 10 μm or more and 20 μm or less. It is desirable that the first protrusion amount P1 exceeds a distance D between the first main surface 3 and the first pn-junction portion 9 (D<P1).

The first trench structure 13 includes a first trench 15, a first insulating film 16, and a first polysilicon 17. The first trench 15 is formed on the first main surface 3 so as to penetrate the first pn-junction portion 9, and partitions the wall surface of the first trench structure 13. Specifically, the first trench 15 penetrates the second region 7 so as to reach the first region 6. More specifically, the first trench 15 extends from the first main surface 3 toward the second main surface 4 side so as to reach the first high-concentration region 6a of the first region 6, and penetrates the second region 7 and the first low-concentration region 6b of the first region 6.

The first insulating film 16 has a first removing portion 16a that covers the wall surface of the first trench 15 and exposes the first region 6 from the first trench 15. Specifically, the first insulating film 16 covers the first region 6, the second region 7, and the third region 8 on the inner peripheral wall and the outer peripheral wall of the first trench 15. The first removing portion 16a exposes the first high-concentration region 6a of the first region 6 from at least the bottom wall of the first trench 15. In this embodiment, the first removing portion 16a is formed in an annular shape extending along the first trench 15 in a plan view. The first removing portion 16a may be formed in an ended strip shape extending along the first trench 15 in a plan view.

In this embodiment, the first insulating film 16 has a stacked structure in which a plurality of insulating films is stacked. Specifically, the first insulating film 16 has a stacked structure including a first lower insulating film 18 and a first upper insulating film 19, which are stacked in this order from the wall surface side of the first trench 15 (see FIG. 4). The first lower insulating film 18 covers the inner peripheral wall and the outer peripheral wall of the first trench 15 and exposes the first high-concentration region 6a of the first region 6 from the bottom wall of the first trench 15. It is desirable that the first lower insulating film 18 is formed of an insulating film having a relatively high density. The first lower insulating film 18 may include a silicon oxide film. It is desirable that the first lower insulating film 18 includes a silicon oxide film formed of the oxide of the chip 2.

The first upper insulating film 19 covers the inner peripheral wall and the outer peripheral wall of the first trench 15 with the first lower insulating film 18 interposed therebetween and exposes the first high-concentration region 6a of the first region 6 from the bottom wall of the first trench 15. The first upper insulating film 19 is thicker than the first lower insulating film 18. It is desirable that the first upper insulating film 19 is formed of an insulating film having a lower density than the first lower insulating film 18. The first upper insulating film 19 may include a silicon oxide film. It is desirable that the first upper insulating film 19 is formed of a TEOS (Tetraethylorthosilicate) film.

The first polysilicon 17 is buried in the first trench 15 with the first insulating film 16 interposed therebetween. The first polysilicon 17 has an exposed portion exposed from the bottom wall of the first trench 15 (the first removing portion 16a of the first insulating film 16) and is mechanically connected to the first region 6 (the first high-concentration region 6a) in the exposed portion. The first polysilicon 17 is electrically insulated from the second region 7 and the third region 8 by the first insulating film 16.

The first polysilicon 17 includes a first portion 20 and a second portion 21. In FIGS. 3 and 4, a boundary between the first portion 20 and the second portion 21 is indicated by a broken line. The first portion 20 is formed in a film shape along the wall surface (the inner peripheral wall, the outer peripheral wall, and the bottom wall) of the first trench 15 so as to partition a recess space in the first trench 15. The first portion 20 is mechanically connected to the first region 6 (the first high-concentration region 6a) at the bottom wall of the first trench 15.

The second portion 21 is buried in the first trench 15 with the first portion 20 interposed therebetween. The second portion 21 faces the bottom wall (the first region 6) of the first trench 15 with the first portion 20 interposed therebetween. The second portion 21 forms a boundary portion extending along the wall surface of the first trench 15 with the first portion 20. The second portion 21 may form a fine pore with the first portion 20 at the boundary portion. Of course, the second portion 21 may be formed completely integrally with the first portion 20 to such an extent that it cannot be distinguished from the first portion 20.

The second trench structure 14 is formed on the first main surface 3 so as to partition the transistor region 11 in a region on the transistor region 11 side of the first trench structure 13 in a plan view. The second trench structure 14 is formed at an interval from the first trench structure 13 on the transistor region 11 side in a plan view and extends in a strip shape along the first trench structure 13. In this embodiment, the second trench structure 14 is formed in an annular shape (square annular shape in this embodiment) extending substantially parallel to the first trench structure 13 in a plan view and partitions the transistor region 11 having a predetermined shape (square shape in this embodiment). In this embodiment, the second trench structure 14 has corner portions (four corners) curved in an arc shape along the corner portions (four corners) of the first trench structure 13 in a plan view.

The planar shape of the second trench structure 14 (the planar shape of the transistor region 11) is arbitrary, and the second trench structure 14 is not necessary to have a planar shape that matches the planar shape of the first trench structure 13. The second trench structure 14 may be formed in a polygonal annular shape, a circular annular shape, or an elliptical annular shape in a plan view, and may partition the transistor region 11 having a polygonal shape, a circular shape, or an elliptical shape in a plan view.

The second trench structure 14 has a second width W2. The second width W2 is a width (maximum value) in a direction orthogonal to a direction which the second trench structure 14 extends in a plan view. The second width W2 is desirably less than the first width W1 (W2<W1). The second width W2 may be 0.5 μm or more and 10 μm or less. The second width W2 is desirably 1.5 μm or more and 3.5 μm or less.

Referring to FIGS. 3 and 4, the second trench structure 14 is formed on the first main surface 3 so as to penetrate the first pn-junction portion 9. Specifically, the second trench structure 14 penetrates the third region 8 and the second region 7 so as to reach the first region 6. More specifically, the second trench structure 14 extends from the first main surface 3 toward the second main surface 4 side so as to reach the first high-concentration region 6a of the first region 6, and penetrates the third region 8, the second region 7, and the first low-concentration region 6b of the first region 6.

The second trench structure 14 includes an inner peripheral wall on the transistor region 11 side, an outer peripheral wall on the first trench structure 13 side, and a bottom wall connecting the inner peripheral wall and the outer peripheral wall. The second trench structure 14 may be formed in a vertical shape in a cross-sectional view. The second trench structure 14 may be formed in a tapered shape toward the first region 6 side in a cross-sectional view. The bottom wall of the second trench structure 14 may be formed in a curved shape toward the second main surface 4. The bottom wall of the second trench structure 14 may have a flat surface parallel to the first main surface 3.

Referring to FIG. 4, the second trench structure 14 protrudes from the first pn-junction portion 9 toward the second main surface 4 side by a second protrusion amount P2. The second protrusion amount P2 may be 1 μm or more and 30 μm or less. It is desirable that the second protrusion amount P2 is 5 μm or more and 25 μm or less. It is particularly desirable that the second protrusion amount P2 is 10 μm or more and 20 μm or less. The second protrusion amount P2 may be less than the first protrusion amount P1 (P2<P1).

In this case, it is desirable that a difference (P1−P2) between the first protrusion amount P1 and the second protrusion amount P2 is 5 μm or less. It is particularly desirable that the difference (P1−P2) is 1 μm or less. Of course, the second protrusion amount P2 may be substantially equal to the first protrusion amount P1 of the first trench structure 13 (P1≈P2). It is desirable that the second protrusion amount P2 exceeds the distance D between the first main surface 3 and the first pn-junction portion 9 (D<P2).

The second trench structure 14 includes a second trench 22, a second insulating film 23, and a second polysilicon 24. The second trench 22 is formed on the first main surface 3 so as to penetrate the first pn-junction portion 9 and partitions the wall surface of the second trench structure 14. Specifically, the second trench 22 penetrates the third region 8 and the second region 7 so as to reach the first region 6. More specifically, the second trench 22 extends from the first main surface 3 toward the second main surface 4 side so as to reach the first high-concentration region 6a of the first region 6, and penetrates the third region 8, the second region 7, and the first low-concentration region 6b of the first region 6.

The second insulating film 23 has a second removing portion 23a that covers the wall surface of the second trench 22 and exposes the first region 6 from the second trench 22. Specifically, the second insulating film 23 covers the first region 6, the second region 7, and the third region 8 on the inner peripheral wall and the outer peripheral wall of the second trench 22. The second removing portion 23a exposes the first high-concentration region 6a of the first region 6 from at least the bottom wall of the second trench 22. In this embodiment, the second removing portion 23a is formed in an annular shape extending along the second trench 22 in a plan view. The second removing portion 23a may be formed in an ended strip shape extending along the second trench 22 in a plan view.

In this embodiment, the second insulating film 23 has a stacked structure in which a plurality of insulating films is stacked. Specifically, the second insulating film 23 has a stacked structure including a second lower insulating film 25 and a second upper insulating film 26, which are stacked in this order from the wall surface side of the second trench 22 (see FIG. 4). The second lower insulating film 25 covers the inner peripheral wall and the outer peripheral wall of the second trench 22 and exposes the first high-concentration region 6a of the first region 6 from the bottom wall of the second trench 22.

It is desirable that the second lower insulating film 25 has a thickness substantially equal to the thickness of the first lower insulating film 18. It is desirable that the second lower insulating film 25 is formed of an insulating film having a relatively high density. The second lower insulating film 25 may include a silicon oxide film. It is desirable that the second lower insulating film 25 includes a silicon oxide film formed of the oxide of the chip 2. It is desirable that the second lower insulating film 25 contains the same insulating material as the first lower insulating film 18.

The second upper insulating film 26 covers the inner peripheral wall and the outer peripheral wall of the second trench 22 with the second lower insulating film 25 interposed therebetween and exposes the first high-concentration region 6a of the first region 6 from the bottom wall of the second trench 22. The second upper insulating film 26 is thicker than the second lower insulating film 25. It is desirable that the second lower insulating film 25 has a thickness substantially equal to the thickness of the first upper insulating film 19.

It is desirable that the second upper insulating film 26 is formed of an insulating film having a lower density than the second lower insulating film 25. The second upper insulating film 26 may include a silicon oxide film or a silicon nitride film. It is desirable that the second upper insulating film 26 is formed of a TEOS film. It is desirable that the second lower insulating film 25 contains the same insulating material as the first upper insulating film 19.

The second polysilicon 24 is buried in the second trench 22 with the second insulating film 23 interposed therebetween. The second polysilicon 24 has an exposed portion exposed from the bottom wall of the second trench 22 (the second removing portion 23a of the second insulating film 23) and is mechanically connected to the first region 6 (the first high-concentration region 6a) in the exposed portion. The second polysilicon 24 is electrically insulated from the second region 7 and the third region 8 by the second insulating film 23.

The semiconductor device 1A includes a mesa portion 27 partitioned in a region between the first trench structure 13 and the second trench structure 14 in the chip 2. The mesa portion 27 is partitioned by the inner peripheral wall of the first trench structure 13 and the outer peripheral wall of the second trench structure 14, and includes a portion of the first region 6, a portion of the second region 7, and a portion of the third region 8.

The mesa portion 27 has a third width W3. The third width W3 is a width (maximum value) in a direction orthogonal to a direction in which the mesa portion 27 extends in a plan view. The third width W3 is also a distance between the first trench structure 13 and the second trench structure 14. The third width W3 may be 0.5 μm or more and 10 μm or less. It is desirable that the third width W3 is 1 μm or more and 3 μm or less. It is desirable that the third width W3 is less than the first width W1 (W1>W3). It is particularly desirable that the third width W3 is less than the second width W2 (W3<W2). Of course, the third width W3 may be equal to or more than the second width W2 (W2≤W3) or may be equal to or more than the first width W1 (W1≤W3).

The semiconductor device 1A includes a p-type first impurity region 31 (semiconductor region) formed in the first polysilicon 17. The first impurity region 31 may be regarded as a constituent element of the first trench structure 13. The first impurity region 31 is formed in the first polysilicon 17 so as to be electrically connected to the first region 6. Specifically, the first impurity region 31 has an exposed portion exposed from the bottom wall of the first trench 15 (the first removing portion 16a of the first insulating film 16) and is electrically connected to the first high-concentration region 6a of the first region 6 in the exposed portion. It is desirable that the first impurity region 31 forms ohmic contact with the first region 6.

It is desirable that the first impurity region 31 is located within a thickness range at least between the bottom wall of the first trench 15 and the first pn-junction portion 9 in a cross-sectional view. It is particularly desirable that the first impurity region 31 is formed in the first polysilicon 17 so as to cross the depth position of the first pn-junction portion 9 in a cross-sectional view. In this embodiment, the first impurity region 31 is formed over the entire region of the first polysilicon 17 in a cross-sectional view.

The first impurity region 31 is formed in a strip shape extending along the first polysilicon 17 in a plan view. Specifically, the first impurity region 31 is formed in an annular shape (square annular shape in this embodiment) extending along the first polysilicon 17 in a plan view. That is, the first impurity region 31 is formed over the entire region of the first polysilicon 17 in a plan view and a cross-sectional view.

In this embodiment, the first impurity region 31 has a concentration gradient in which the p-type impurity concentration gradually decreases from the inner side of the first polysilicon 17 toward the wall surface side of the first trench 15 in a cross-sectional view. In other words, the first impurity region 31 has a concentration gradient in which the p-type impurity concentration on the peripheral side of the first polysilicon 17 is lower than the p-type impurity concentration on the inner side of the first polysilicon 17.

Specifically, the first impurity region 31 includes a first concentration portion 32 and a second concentration portion 33. The first concentration portion 32 is a low concentration portion having a relatively low p-type impurity concentration and is formed on the peripheral portion of the first polysilicon 17. Specifically, the first concentration portion 32 is formed in a film shape extending along the wall surface of the first trench 15 and is electrically connected to the first high-concentration region 6a of the first region 6 on the bottom wall of the first trench 15. More specifically, the first concentration portion 32 is formed in the first portion 20 of the first polysilicon 17. It is desirable that the first concentration portion 32 is formed over the entire region of the first portion 20.

The first concentration portion 32 contains n-type impurities (pentavalent element) introduced at a first concentration and p-type impurities (trivalent element) introduced at a second concentration exceeding the first concentration. That is, the first concentration portion 32 is formed of a p-type offset region in which an n-type portion is replaced with a p-type portion. The offset region may be referred to as a "canceling region" or a "compensation region."

The p-type impurity concentration (first concentration) of the first concentration portion 32 may be $1 \times 10^{16}$ cm$^{-3}$ or more and $1 \times 10^{19}$ cm$^{-3}$ or less. The n-type impurity concentration (second concentration) of the first concentration portion 32 may be $1 \times 10^{12}$ cm$^{-3}$ or more and $1 \times 10^{16}$ cm$^{-3}$ or less. The first concentration portion 32 may contain boron (B) as the p-type impurity and may contain phosphorus (P) or arsenic (As) as the n-type impurity. It is desirable that the first concentration portion 32 contains phosphorus (P) as the n-type impurity.

The second concentration portion 33 is a high concentration portion having a higher p-type impurity concentration than the first concentration portion 32 and is formed in the inner portion of the first polysilicon 17. Specifically, the second concentration portion 33 is formed in a region surrounded by the first concentration portion 32 in the first polysilicon 17. More specifically, the second concentration portion 33 is formed in the second portion 21 of the first polysilicon 17. It is desirable that the second concentration portion 33 is formed over the entire region of the second portion 21.

The second concentration portion 33 contains p-type impurities (trivalent element). The p-type impurity concentration of the second concentration portion 33 may be $1 \times 10^{16}$ cm$^{-3}$ or more and $1 \times 10^{22}$ cm$^{-3}$ or less. The p-type impurity concentration of the second concentration portion 33 may be substantially equal to the p-type impurity concentration (first concentration) of the first concentration portion 32. The second concentration portion 33 may contain boron (B) as the p-type impurity. Of course, the second concentration portion 33 may contain a small amount of n-type impurities diffused from the first concentration portion 32.

The semiconductor device 1A includes a p-type second impurity region 34 (semiconductor region) formed in the second polysilicon 24. The second impurity region 34 may be regarded as a constituent element of the second trench structure 14. The second impurity region 34 is formed in the second polysilicon 24 so as to be electrically connected to the first region 6. Specifically, the second impurity region 34 has an exposed portion exposed from the bottom wall of the second trench 22 (the second removing portion 23a of the second insulating film 23) and is electrically connected to the first high-concentration region 6a of the first region 6 in the exposed portion. It is desirable that the second impurity region 34 forms ohmic contact with the first region 6.

It is desirable that the second impurity region 34 is located within a thickness range between the bottom wall of the second trench 22 and the first pn-junction portion 9 in a cross-sectional view. It is desirable that the second impurity region 34 is not formed in the entire region of the second polysilicon 24 in a cross-sectional view. It is desirable that the second impurity region 34 is formed at an interval from the upper end portion of the second polysilicon 24 to the lower end portion side thereof so as not to be exposed from the upper end portion of the second polysilicon 24 in a cross-sectional view.

It is desirable that the second impurity region 34 is formed at an interval from the depth position of the first pn-junction portion 9 to the lower end portion side of the second poly silicon 24 so as not to cross the depth position of the first pn-junction portion 9 in a cross-sectional view. In this embodiment, the second impurity region 34 is formed at an interval from an intermediate portion between the first pn-junction portion 9 and the bottom wall of the second trench 22 to the lower end portion side of the second polysilicon 24.

The second impurity region 34 is formed at an interval from a depth position of a boundary portion between the first high-concentration region 6a and the first low-concentration region 6b of the first region 6 to the lower end portion side of the second poly silicon 24 so as not to cross the boundary portion. That is, the second impurity region 34 faces the first high-concentration region 6a with the second insulating film 23 interposed therebetween and does not face the first low-concentration region 6b with the second insulating film 23 interposed therebetween.

The second impurity region 34 is formed in a strip shape extending along the second polysilicon 24 in a plan view. Specifically, the second impurity region 34 is formed in an annular shape (a square annular shape in this embodiment) extending along the second polysilicon 24 in a plan view. That is, the second impurity region 34 is formed over the entire region of the lower end portion of the second polysilicon 24 in a plan view.

The second impurity region 34 contains n-type impurities introduced at a third concentration and p-type impurities introduced at a fourth concentration exceeding the third concentration. That is, the second impurity region 34 is formed of a p-type offset region in which an n-type portion is replaced with a p-type portion. The p-type impurity concentration (third concentration) of the second impurity region 34 may be $1 \times 10^{17}$ cm$^{-3}$ or more and $1 \times 10^{20}$ cm$^{-3}$ or less. The n-type impurity concentration (fourth concentration) of the second impurity region 34 may be $1\times10^{12}$ cm$^{-3}$ or more and $1\times10^{16}$ cm$^{-3}$ or less.

It is desirable that the n-type impurity concentration (third concentration) of the second impurity region 34 is substantially equal to the n-type impurity concentration (first concentration) of the first concentration portion 32 of the first impurity region 31. It is desirable that the p-type impurity concentration (fourth concentration) of the second impurity region 34 is different from the p-type impurity concentration (second concentration) of the second concentration portion 33 of the first impurity region 31. The second impurity region 34 may contain boron (B) as the p-type impurity and may contain phosphorus (P) or arsenic (As) as the n-type impurity. It is desirable that the first concentration portion 32 of the second impurity region 34 contains phosphorus (P) as the n-type impurity.

The semiconductor device 1A includes an n-type third impurity region 35 (semiconductor region) formed in a region different from the second impurity region 34 in the second poly silicon 24. The third impurity region 35 may be regarded as a constituent element of the second trench structure 14. The third impurity region 35 may have an n-type impurity concentration of $1\times10^{12}$ cm$^{-3}$ or more and $1\times10^{16}$ cm$^{-3}$ or less.

It is desirable that the n-type impurity concentration of the third impurity region 35 is substantially equal to the n-type impurity concentration (first concentration) of the first concentration portion 32 of the first impurity region 31. That is, it is desirable that the n-type impurity concentration of the third impurity region 35 is substantially equal to the n-type impurity concentration (fourth concentration) in the second impurity region 34. The third impurity region 35 may contain phosphorus (P) or arsenic (As) as the n-type impurity. It is desirable that the third impurity region 35 contains phosphorus (P) as the n-type impurity.

The third impurity region 35 is formed on the upper end portion side of the second polysilicon 24 with respect to the second impurity region 34 in a cross-sectional view. The third impurity region 35 is located within a thickness range between the second impurity region 34 and the first pn-junction portion 9 in a cross-sectional view, and is electrically connected to the second impurity region 34. It is desirable that the third impurity region 35 is electrically connected to the second impurity region 34 in a region on the bottom wall side of the second trench 22 (that is, a region on the lower end portion side of the second polysilicon 24) with respect to the depth position of the first pn-junction portion 9.

It is desirable that the third impurity region 35 is formed so as to cross the depth position of the first pn-junction portion 9 in a cross-sectional view. In this embodiment, the third impurity region 35 is formed within a thickness range between the upper end portion of the second poly silicon 24 and the second impurity region 34 so as to be exposed from the upper end portion of the second polysilicon 24 in a cross-sectional view. The third impurity region 35 faces the first region 6, the second region 7, and the third region 8 with the second insulating film 23 interposed therebetween.

That is, the third impurity region 35 is electrically insulated from the first region 6, the second region 7, and the third region 8 by the second insulating film 23. The third impurity region 35 is formed in a strip shape extending along the second polysilicon 24 in a plan view. Specifically, the third impurity region 35 is formed in an annular shape (square annular shape in this embodiment) extending along the second polysilicon 24 in a plan view. That is, the third impurity region 35 is formed in the entire region on the upper end portion side of the second poly silicon 24 in a plan view.

The semiconductor device 1A includes a second pn-junction portion 36 formed in a middle portion of the second polysilicon 24 in the thickness direction. The second pn-junction portion 36 may be regarded as a constituent element of the second trench structure 14. The second pn-junction portion 36 may be referred to as a "second pn-connection portion" or a "second pn-boundary portion." The second pn-junction portion 36 is formed at a boundary between the second impurity region 34 and the third impurity region 35.

That is, the third impurity region 35 is formed in the second polysilicon 24 so as to form the second impurity region 34 and the second pn-junction portion 36. The second pn-junction portion 36 is located in a region on the bottom wall side of the second trench 22 with respect to the depth position of the first pn-junction portion 9. Further, the second pn-junction portion 36 is formed within a thickness range facing the first high-concentration region 6a of the first region 6 with the second insulating film 23 interposed therebetween.

It is desirable that a distance DJ between the second pn-junction portion 36 and the bottom wall of the second trench 22 (that is, the thickness of the second impurity region 34) is less than the distance D between the first main surface 3 and the first pn-junction portion 9 (DJ<D). It is desirable that the distance DJ is less than a distance between the first pn-junction portion 9 and the second pn-junction portion 36. It is desirable that the distance DJ is ½ or less of the second protrusion amount P2 of the second trench structure 14 (DJ≤½×P2). It is desirable that the distance DJ is ½ or less of the first protrusion amount P1 of the first trench structure 13 (DJ≤½×P1). The distance DJ may be less than the third width W3 of the mesa portion 27 (DJ<W3).

In this way, the semiconductor device 1A includes a second diode D2 having the second impurity region 34 as an anode and the third impurity region 35 as a cathode in the second trench 22. That is, the second diode D2 is formed within a region between the first region 6 and the third impurity region 35 via the bottom wall of the second trench 22. The anode of the second diode D2 is electrically connected to the anode of the first diode D1 via the first region 6. That is, the second diode D2 (the second pn-junction portion 36) is reverse-biased to the first diode D1 (the first pn-junction portion 9) via the bottom wall of the second trench 22.

The semiconductor device 1A includes at least one n-type sinker region 37 (a plurality of n-type sinker regions in this embodiment) that covers a side wall of the second trench structure 14 in the chip 2. The plurality of sinker regions 37 is formed in the third region 8 so as to cover the inner peripheral wall and the outer peripheral wall of the second trench structure 14. The plurality of sinker regions 37 has an n-type impurity concentration higher than that of the third region 8. The n-type impurity concentration of the plurality of sinker regions 37 may be $1\times10^{15}$ cm$^{-3}$ or more and $1\times10^{19}$ cm$^{-3}$ or less.

The plurality of sinker regions 37 extends in the thickness direction of the chip 2 along each of the inner peripheral wall and the outer peripheral wall of the second trench structure 14 in a cross-sectional view. The lower end portions of the plurality of sinker regions 37 may be connected to the second region 7 (the second high-concentration region 7b). The plurality of sinker regions 37 is each formed in an annular shape extending along the inner peripheral wall and the outer peripheral wall of the second trench 22 in a plan view.

In this embodiment, a sinker region 37 on the outer peripheral wall side is formed at a distance from the first trench structure 13 and does not cover the first trench structure 13. Of course, a sinker region 37 that covers the inner peripheral wall of the first trench structure 13 may be formed. Further, a sinker region 37 that covers the outer peripheral wall of the first trench structure 13 may be formed.

The semiconductor device 1A includes a p-type bottom wall region 38 formed in a region along the bottom wall of the first trench structure 13 in the chip 2. The bottom wall region 38 is formed in the first region 6 so as to cover the bottom wall of the first trench structure 13. The bottom wall region 38 has a higher p-type impurity concentration than the first region 6. Specifically, the bottom wall region 38 is formed in the first high-concentration region 6a in the first region 6 and has a higher p-type impurity concentration than the first high-concentration region 6a. The bottom wall region 38 may cover the lower end portion of the side wall of the first trench structure 13.

Referring to FIGS. 3 and 4, the semiconductor device 1A includes a plurality of first trench insulation structures 41 formed on the first main surface 3. In FIG. 2, the illustration of the first trench insulation structures 41 is omitted. The plurality of first trench insulation structures 41 may be referred to as STI (Shallow Trench Isolation) structures. The plurality of first trench insulation structures 41 is each formed at intervals so as to cover the inner peripheral wall and the outer peripheral wall of the first trench 15 and to expose the first polysilicon 17.

The plurality of first trench insulation structures 41 is formed at intervals from the first pn-junction portion 9 to the first main surface 3 side. In this embodiment, the plurality of first trench insulation structures 41 is formed at intervals from the second region 7 to the first main surface 3 side. That is, the plurality of first trench insulation structures 41 is formed within a thickness range of the third region 8. The plurality of first trench insulation structures 41 is formed in a strip shape extending along the first trench structure 13 in a plan view. In this embodiment, the plurality of first trench insulation structures 41 is formed in an annular shape (square annular shape in this embodiment) extending along the first trench structure 13 in a plan view.

Each first trench insulation structure 41 includes a first shallow trench 42 and a first buried insulator 43. The first shallow trench 42 is formed at a position where it overlaps the side wall (the inner peripheral wall or the outer peripheral wall) of the first trench 15, and exposes the third region 8, the first insulating film 16, and the first polysilicon 17. That is, the first shallow trench 42 exposes the first impurity region 31.

The first buried insulator 43 is buried in the first shallow trench 42. The first buried insulator 43 is in contact with the third region 8, the first insulating film 16, and the first polysilicon 17 in the first shallow trench 42. That is, the first buried insulator 43 is in contact with the first impurity region 31 (the first concentration portion 32 and the second concentration portion 33) in the first shallow trench 42. The first buried insulator 43 may contain at least one of silicon oxide and silicon nitride.

Referring to FIGS. 3 and 4, the semiconductor device 1A includes a plurality of second trench insulation structures 44 formed on the first main surface 3. In FIG. 2, the illustration of the second trench insulation structures 44 is omitted. The plurality of second trench insulation structures 44 may be referred to as STI structures. The plurality of second trench insulation structures 44 are formed at intervals so as to cover the inner peripheral wall and the outer peripheral wall of the second trench 22 and to expose the second polysilicon 24.

The plurality of second trench insulation structures 44 is formed at intervals from the first pn-junction portion 9 to the first main surface 3 side. In this embodiment, the plurality of second trench insulation structures 44 is formed at intervals from the second region 7 to the first main surface 3 side. That is, the plurality of second trench insulation structures 44 is formed within the thickness range of the third region 8. The plurality of second trench insulation structures 44 is formed in a strip shape extending along the second trench structure 14 in a plan view. In this embodiment, the plurality of second trench insulation structures 44 is formed in an annular shape (square annular shape in this embodiment) extending along the second trench structure 14 in a plan view.

Each second trench insulation structure 44 includes a second shallow trench 45 and a second buried insulator 46. The second shallow trench 45 is formed at a position where it overlaps the side wall (the inner peripheral wall or the outer peripheral wall) of the second trench 22 and exposes the third region 8, the second insulating film 23, and the second polysilicon 24. The second shallow trench 45 exposes the third impurity region 35 and does not expose the second impurity region 34. In this embodiment, the second shallow trench 45 exposes the plurality of sinker regions 37.

The second buried insulator 46 is buried in the second shallow trench 45. The second buried insulator 46 is in contact with the third region 8, the second insulating film 23, and the second polysilicon 24 in the second shallow trench 45. That is, the second buried insulator 46 is in contact with the third impurity region 35 in the second shallow trench 45. The second buried insulator 46 may contain at least one of silicon oxide and silicon nitride.

Referring to FIG. 3, the semiconductor device 1A includes a planar gate type MOSFET cell 50 as an example of a functional device formed in the transistor region 11. In FIG. 2, the illustration of the MISFET cell 50 is omitted. The MISFET cell 50 may take any one form of a HV (High Voltage)-MISFET cell (for example, 100 V or more and 1,000 V or less), a MV (Middle Voltage)-MISFET cell (for example, 30 V or more and 100 V or less), and a LV (Low Voltage-MISFET cell (for example, 1 V or more and 30 V or less) depending on a magnitude of a drain-source voltage. In this embodiment, an example in which the MISFET cell 50 is formed of the HV-MISFET cell will be described, but it is not intended to limit the form of the MISFET cell 50 to the HV-MISFET cell.

In this embodiment, the MISFET cell 50 includes at least one (one in this embodiment) n-type first well region 51, at least one (plural in this embodiment) p-type second well region 52, at least one (plural in this embodiment) n-type drain region 53, at least one (plural in this embodiment) n-type source region 54, at least one (plural in this embodiment) p-type channel region 55, at least one (plural in this embodiment) p-type contact region 56, and at least one (plural in this embodiment) planar gate structure 57 in a cross-sectional view.

The first well region 51 is formed in the surface layer portion of the third region 8 in the transistor region 11. The first well region 51 has a higher n-type impurity concentration than that of the third region 8. The plural second well regions 52 are formed in the surface layer portion of the third region 8 at intervals from the first well region 51 in the transistor region 11. One second well region 52 is formed at an interval from the first well region 51 to one side of the first direction X, and the other second well region 52 is formed at an interval from the first well region 51 to the other side of the first direction X.

The drain region 53 is formed on the surface layer portion of the first well region 51 at an interval inward from the peripheral edge of the first well region 51. The plural source regions 54 are formed on the surface layer portions of the corresponding second well regions 52 at intervals inward from the peripheral edges of the corresponding second well regions 52, respectively. The plural channel regions 55 are formed between the third region 8 and the source region 54 in the surface layer portions of the corresponding second well regions 52, respectively. The plural contact regions 56 are formed on the surface layer portions of the corresponding second well regions 52 at intervals inward from the peripheral edges of the corresponding second well regions 52, respectively. The plural contact regions 56 are adjacent to the corresponding source regions 54.

The plural planar gate structures 57 are formed on the first main surface 3 so as to cover the corresponding channel regions 55, respectively, and control the on/off of the corresponding channel regions 55. In this embodiment, the plural planar gate structures 57 are formed so as to extend from the first well region 51 to the corresponding source regions 54, respectively.

Each of the plurality of planar gate structures 57 includes a gate insulating film 58 and a gate electrode 59, which are stacked in this order from the first main surface 3 side. The gate insulating film 58 may include a silicon oxide film. It is desirable that the gate insulating film 58 includes a silicon oxide film formed of the oxide of the chip 2. It is desirable that the gate electrode 59 contains polysilicon. The gate electrode 59 may include either or both of an n-type region and a p-type region formed in polysilicon.

Referring to FIG. 3, the semiconductor device 1A includes a plurality of third trench insulation structures 60 formed on the first main surface 3. In FIG. 2, the illustration of the third trench insulation structure 60 is omitted. The plurality of third trench insulation structures 60 may be referred to as STI structures. In this embodiment, the plurality of third trench insulation structures 60 are formed at intervals so as to partition the drain region 53 from other regions and the outer edges of the plurality of second well regions 52 from other regions.

The plurality of third trench insulation structures 60 are formed at intervals from the first pn-junction portion 9 to the first main surface 3 side. In this embodiment, the plurality of third trench insulation structures 60 are formed at intervals from the second region 7 to the first main surface 3 side. That is, the plurality of third trench insulation structures 60 are formed within the thickness range of the third region 8.

Each third trench insulation structure 60 includes a third shallow trench 61 and a third buried insulator 62. The third shallow trench 61 is dug down from the first main surface 3 to the second main surface 4. The third buried insulator 62 is buried in the third shallow trench 61. The third buried insulator 62 may contain at least one selected from the group of silicon oxide and silicon nitride.

In the transistor region 11, a drain potential VD is applied to the drain region 53 via a drain contact electrode 63. In FIG. 3, the drain contact electrode 63 is shown simplified by an arrow. The drain potential VD is the maximum device potential in the transistor region 11. A source potential VS lower than the drain potential VD is applied to the source region 54 via a source contact electrode 64. In FIG. 3, the source contact electrode 64 is shown simplified by an arrow. A gate potential VG is applied to the gate electrode 59 via a gate contact electrode 65. In FIG. 3, the gate contact electrode 65 is shown simplified by an arrow.

A first potential V1 is applied to the first trench structure 13 via a first contact electrode 71. In FIGS. 3 and 4, the first contact electrode 71 is shown simplified by an arrow. The first potential V1 is also a potential applied to the first impurity region 31. The first potential V1 applied to the first trench structure 13 is applied to the first region 6 via the first trench structure 13.

As a result, the first region 6 is fixed at the same potential as the first trench structure 13. It is desirable that the first potential V1 is a potential equal to or lower than the drain potential VD (desirably lower than the drain potential VD). That is, it is desirable that the first potential V1 is lower than the maximum device potential. The first potential V1 may be a reference potential or a ground potential that serves as a reference for circuit operation. It is desirable that the first potential V1 is the ground potential.

A second potential V2 is applied to the second trench structure 14 via a second contact electrode 72. In FIGS. 3 and 4, the second contact electrode 72 is shown simplified by an arrow. It is desirable that the second potential V2 is a potential equal to or lower than the drain potential VD (desirably lower than the drain potential VD). That is, it is desirable that the second potential V2 is lower than the maximum device potential.

It is desirable that the second potential V2 is equal to or higher than the first potential V1 (V1≤V2). It is particularly desirable that the second potential V2 exceeds the first potential V1 (V1<V2). It is desirable that a potential difference V2−V1 between the second potential V2 and the first potential V1 is set to be a reverse bias voltage with respect to the second pn-junction portion 36 (the second diode D2). Under this condition, the conduction (forward current) of the second diode D2 in the second trench structure 14 is sure to be suppressed.

The second potential V2 may be a reference potential, a ground potential, or a floating potential. The floating potential means that the second trench structure 14 is electrically formed in a floating state. In this case, since a specific potential is not applied to the second trench structure 14 from a specific member or region, the second potential V2 that fluctuates due to a potential around the second trench structure 14 is applied to the second trench structure 14.

A third potential V3 is applied to the mesa portion 27 via a third contact electrode 73. In FIGS. 3 and 4, the third contact electrode 73 is shown simplified by an arrow. It is desirable that the third potential V3 is a potential equal to or lower than the drain potential VD (desirably lower than the drain potential VD). That is, it is desirable that the third potential V3 is lower than the maximum device potential.

It is desirable that the third potential V3 is equal to or higher than the first potential V1 (V1≤V3). It is particularly desirable that the third potential V3 exceeds the first potential V1 (V1<V3). It is desirable that the third potential V3 is equal to or lower than the second potential V2 (V3≤V2). It is particularly desirable that the third potential V3 is lower than the second potential V2 (V3<V2). In this case, it is desirable that the first to third potentials V1 to V3 are set so as to gradually decrease in a direction away from the transistor region 11 (in the order of VD>V2>V3>V1).

It is desirable that a potential difference V3−V1 between the third potential V3 and the first potential V1 is set to be a reverse bias voltage with respect to the first pn-junction portion 9 (the first diode D1). Under this condition, the conduction (forward current) of the first diode D1 in the mesa portion 27 is sure to be suppressed.

The third potential V3 may be a reference potential, a ground potential, or a floating potential. The floating potential means that the mesa portion 27 is electrically formed in a floating state. In this case, since a specific potential is not applied to the mesa portion 27 from a specific member or region, the third potential V3 that fluctuates due to a potential around the mesa portion 27 is applied to the mesa portion 27.

As described above, the semiconductor device 1A includes the chip 2, the p-type (first conduction type) first region 6, the n-type (second conduction type) second region 7, the transistor region 11 (the device region 10), the first trench structure 13 (the first groove structure), and the second trench structure 14 (the second groove structure). The chip 2 has the first main surface 3 on one side and the second main surface 4 on the other side. The first region 6 is formed on the second main surface 4 side in the chip 2. The second region 7 is formed on the first main surface 3 side in the chip 2 and forms the first pn-junction portion 9 with the first region 6. The transistor region 11 is provided on the first main surface 3.

The first trench structure 13 partitions the transistor region 11 on the first main surface 3. The first trench structure 13 includes the first trench 15 (the first groove), the first insulating film 16, and the first polysilicon 17. The first trench 15 penetrates the first pn-junction portion 9 from the first main surface 3. The first insulating film 16 exposes the first region 6 from the wall surface of the first trench 15. The first polysilicon 17 is buried in the first trench 15 with the first insulating film 16 interposed therebetween.

The second trench structure 14 partitions the transistor region 11 on the transistor region 11 side of the first trench structure 13 on the first main surface 3. The second trench structure 14 includes the second trench 22 (the second groove), the second insulating film 23, and the second polysilicon 24. The second trench 22 penetrates the first pn-junction portion 9 from the first main surface 3. The second insulating film 23 exposes the first region 6 from the wall surface of the second trench 22. The second polysilicon 24 is buried in the second trench 22 with the second insulating film 23 interposed therebetween.

According to this structure, it is possible to provide the semiconductor device 1A capable of improving a breakdown voltage (withstand voltage) by a multi-trench separation structure including the first trench structure 13 which exposes the first region 6, and the second trench structure 14 which exposes the first region 6.

It is desirable that the first polysilicon 17 is buried in the first trench 15 with the first insulating film 16 interposed therebetween so as to be connected to the first region 6 and electrically insulated from the second region 7. It is desirable that the second polysilicon 24 is buried in the second trench 22 with the second insulating film 23 interposed therebetween so as to be connected to the first region 6 and electrically insulated from the second region 7.

It is desirable that the semiconductor device 1A includes the p-type first impurity region 31 formed in the first polysilicon 17 and the p-type second impurity region 34 formed in the second polysilicon 24. It is desirable that the first impurity region 31 is located within the thickness range between the bottom wall of the first trench 15 and the first pn-junction portion 9 so as to be electrically connected to the first region 6. It is desirable that the second impurity region 34 is located within the thickness range between the bottom wall of the second trench 22 and the first pn-junction portion 9 so as to be electrically connected to the first region 6.

It is desirable that the second impurity region 34 is formed in the region on the lower end portion side of the second polysilicon 24 at an interval from the upper end portion of the second polysilicon 24 to the lower end portion side thereof. It is desirable that the second impurity region 34 is formed in a portion of the second polysilicon 24 and is not formed in the entire region of the second polysilicon 24. It is desirable that the second impurity region 34 is formed in the region on the lower end portion side of the second polysilicon 24 so as not to cross the depth position of the first pn-junction portion 9. It is desirable that the first impurity region 31 is formed in the first polysilicon 17 so as to cross the depth position of the first pn-junction portion 9. It is desirable that the first impurity region 31 is formed over the entire region of the first polysilicon 17.

It is desirable that the semiconductor device 1A includes the n-type third impurity region 35 formed in a region different from the second impurity region 34 inside the second polysilicon 24. It is desirable that the third impurity region 35 forms the second pn-junction portion 36 with the second impurity region 34 in the second trench 22. It is desirable that the third impurity region 35 is formed in the region on the upper end portion side of the second polysilicon 24 so as to form the second impurity region 34 and the second pn-junction portion 36 in the region on the lower end portion side of the second polysilicon 24 with respect to the depth position of the first pn-junction portion 9.

Figure 5:
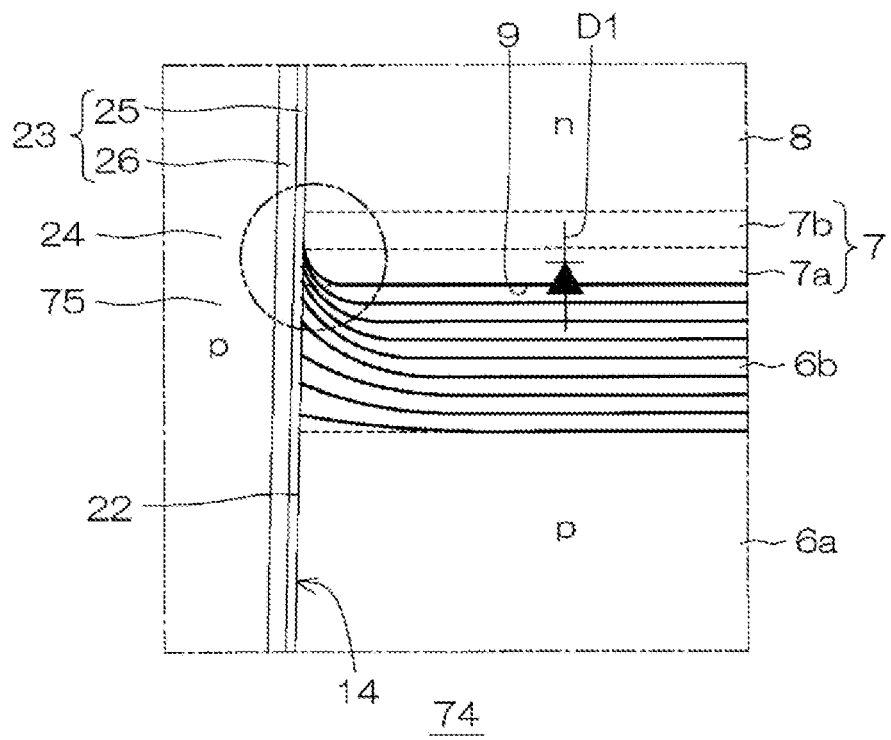
FIG. 5 is an enlarged view of a main part which shows an electric field distribution of a semiconductor device according to a reference embodiment.
Figure 6:
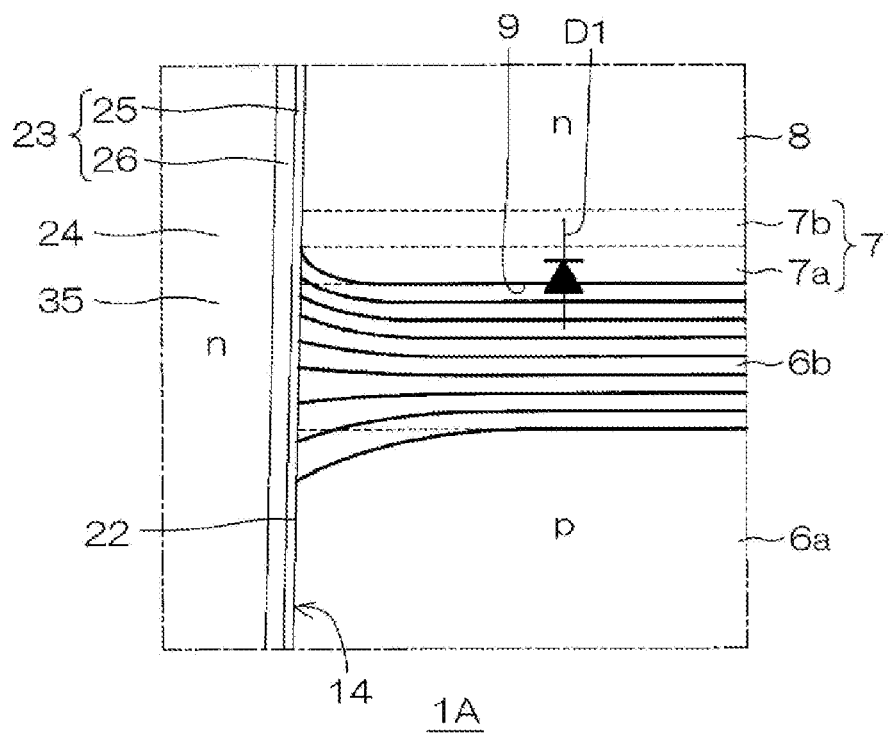
FIG. 6 is an enlarged view of a main part which shows an electric field distribution of the semiconductor device shown in FIG. 1.

According to the structure having the second pn-junction portion 36 (the second impurity region 34 and the third impurity region 35), the following effects described with reference to FIGS. 5 and 6 are achieved. FIG. 5 is an enlarged view of a main part which shows an electric field distribution (see a thick line in FIG. 5) of a semiconductor device 74 according to a reference embodiment. In the semiconductor device 74 according to the reference example, the second insulating film 23 which covers the entire region of the wall surface of the second trench 22 is formed, and the second polysilicon 24 is electrically insulated from the first region 6.

The semiconductor device 74 according to the reference example includes a p-type impurity region 75 formed in the entire region inside the second polysilicon 24. That is, the second pn-junction portion 36 (that is, the second diode D2) is not formed in the second polysilicon 24. In the semiconductor device 74 according to the reference example, a region where an electric field distribution becomes dense is formed at an intersection of the second trench structure 14 and the first pn-junction portion 9 (see a region indicated by a two-dot chain line in FIG. 5). In the semiconductor device 74 according to the reference example, a breakdown voltage (that is, withstand voltage) decreases due to this kind of electric field concentration.

FIG. 6 is an enlarged view of a main part which shows an electric field distribution (see a thick line in FIG. 6) of the semiconductor device 1A shown in FIG. 1. Referring to FIG. 6, unlike the semiconductor device 74 according to the reference example, the semiconductor device 1A includes the chip 2, the first pn-junction portion 9, the transistor region 11 (the device region 10), the second trench structure 14 (the groove structure), and the second pn-junction portion 36. The chip 2 has the first main surface 3. The first pn-junction portion 9 is formed inside the chip 2 so as to extend along the first main surface 3. The transistor region 11 is provided on the first main surface 3.

The second trench structure 14 partitions the transistor region 11 on the first main surface 3. The second trench structure 14 includes the second trench 22 (the groove), the second insulating film 23, and the second polysilicon 24. The second trench 22 penetrates the second pn-junction portion 36 from the first main surface 3. The second insulating film 23 exposes the first region 6 from the wall surface of the second trench 22. The second polysilicon 24 is buried in the second trench 22 with the second insulating film 23 interposed therebetween. The second pn-junction portion 36 is formed in the second polysilicon 24.

According to this structure, the electric field distribution at the intersection of the second trench structure 14 and the first pn-junction portion 9 can be made sparse. As a result, since the electric field concentration on the second trench structure 14 can be suppressed, it is possible to provide the semiconductor device 1A capable of improving the breakdown voltage (that is, withstand voltage).

In such a structure, it is desirable that the second pn-junction portion 36 is reverse-biased to the first pn-junction portion 9 via the bottom wall of the second trench 22. It is desirable that the second pn-junction portion 36 is located in the region on the bottom wall side of the second trench 22 with respect to the depth position of the first pn-junction portion 9. That is, it is desirable that the second impurity region 34 is formed in the region on the lower end side of the second polysilicon 24 with respect to the depth position of the first pn-junction portion 9 and the third impurity region 35 is formed in the second polysilicon 24 so as to cross the depth position of the first pn-junction portion 9. It is desirable that the distance from the first pn-junction portion 9 to the bottom wall of the second trench 22 is larger than the distance from the first pn-junction portion 9 to the first main surface 3.

Figure 7A:
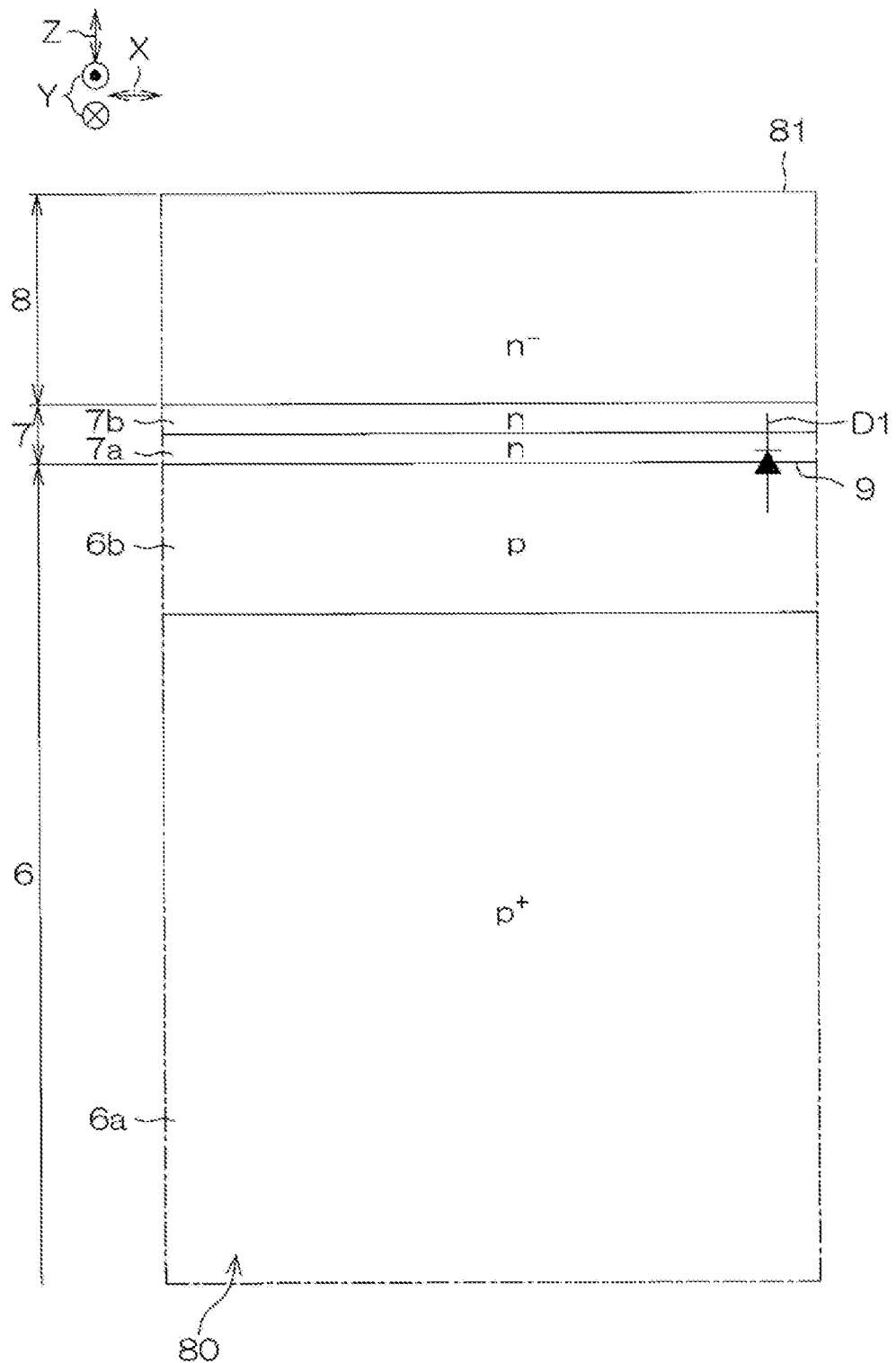
FIG. 7A is a cross-sectional view showing an example of a method of manufacturing the semiconductor device shown in FIG. 1.
Figure 7B:
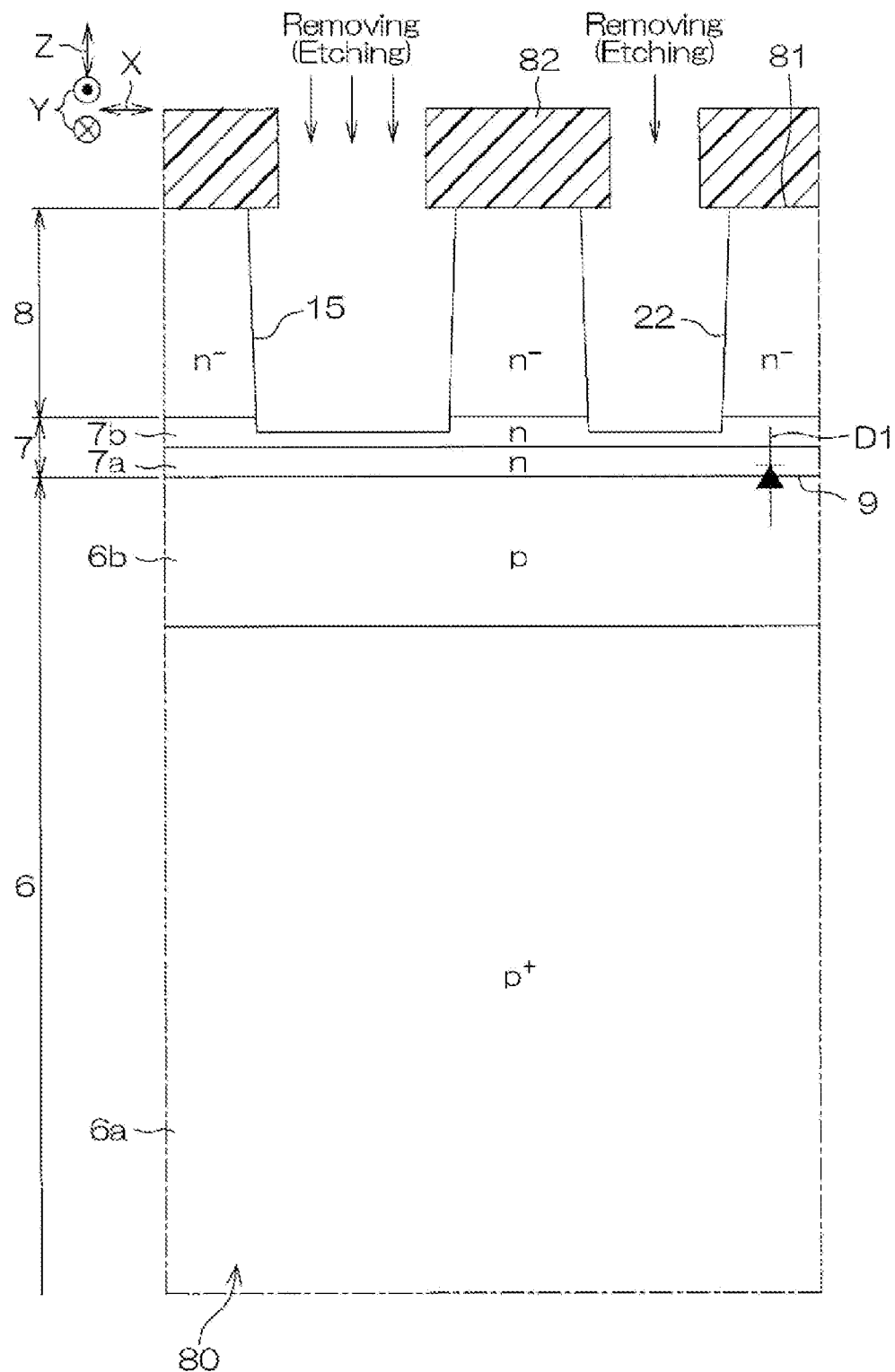
FIG. 7B is a cross-sectional view showing a step subsequent to the step shown in FIG. 7A.
Figure 7C:
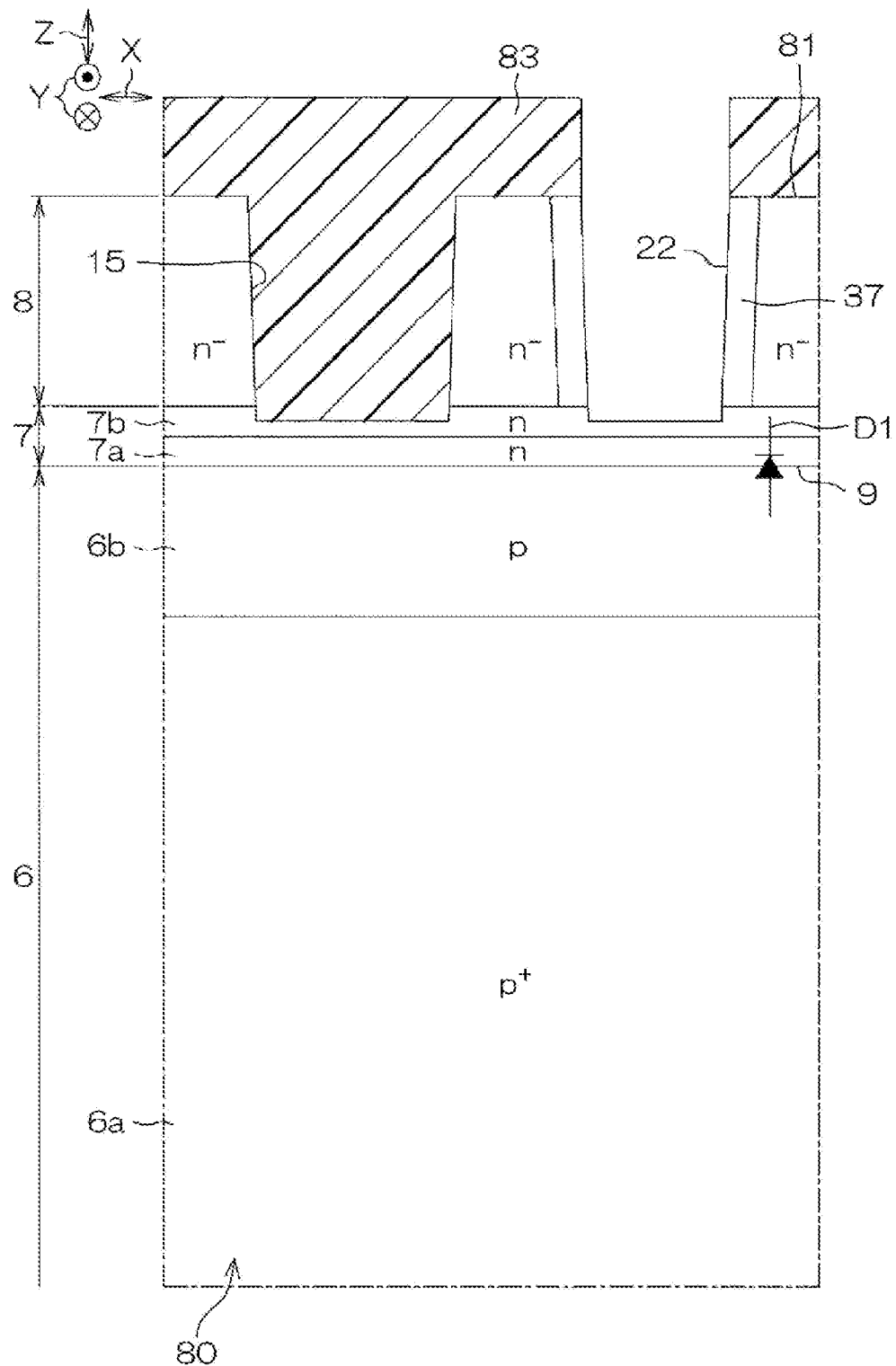
FIG. 7C is a cross-sectional view showing a step subsequent to the step shown in FIG. 7B.
Figure 7D:
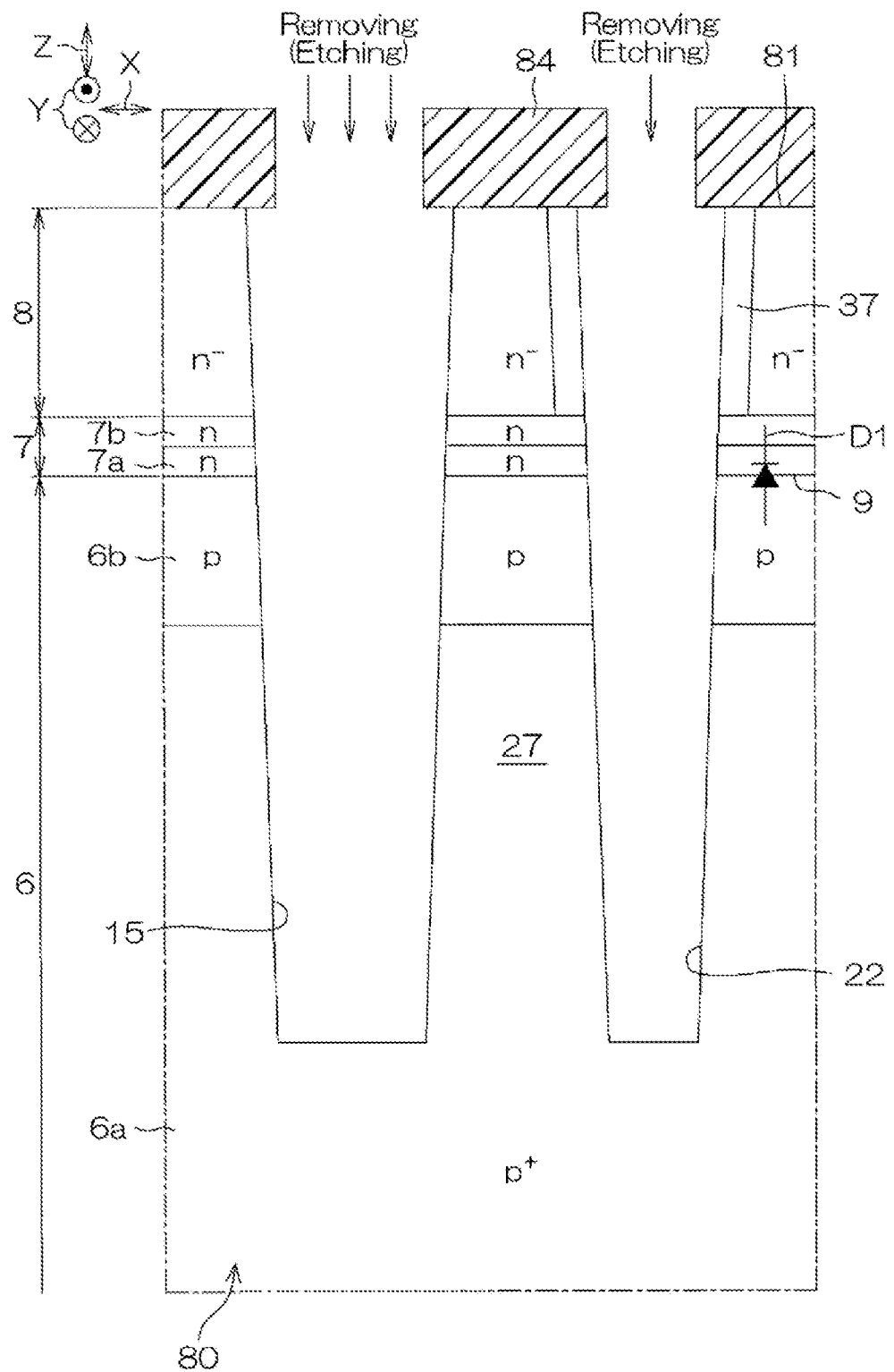
FIG. 7D is a cross-sectional view showing a step subsequent to the step shown in FIG. 7C.
Figure 7E:
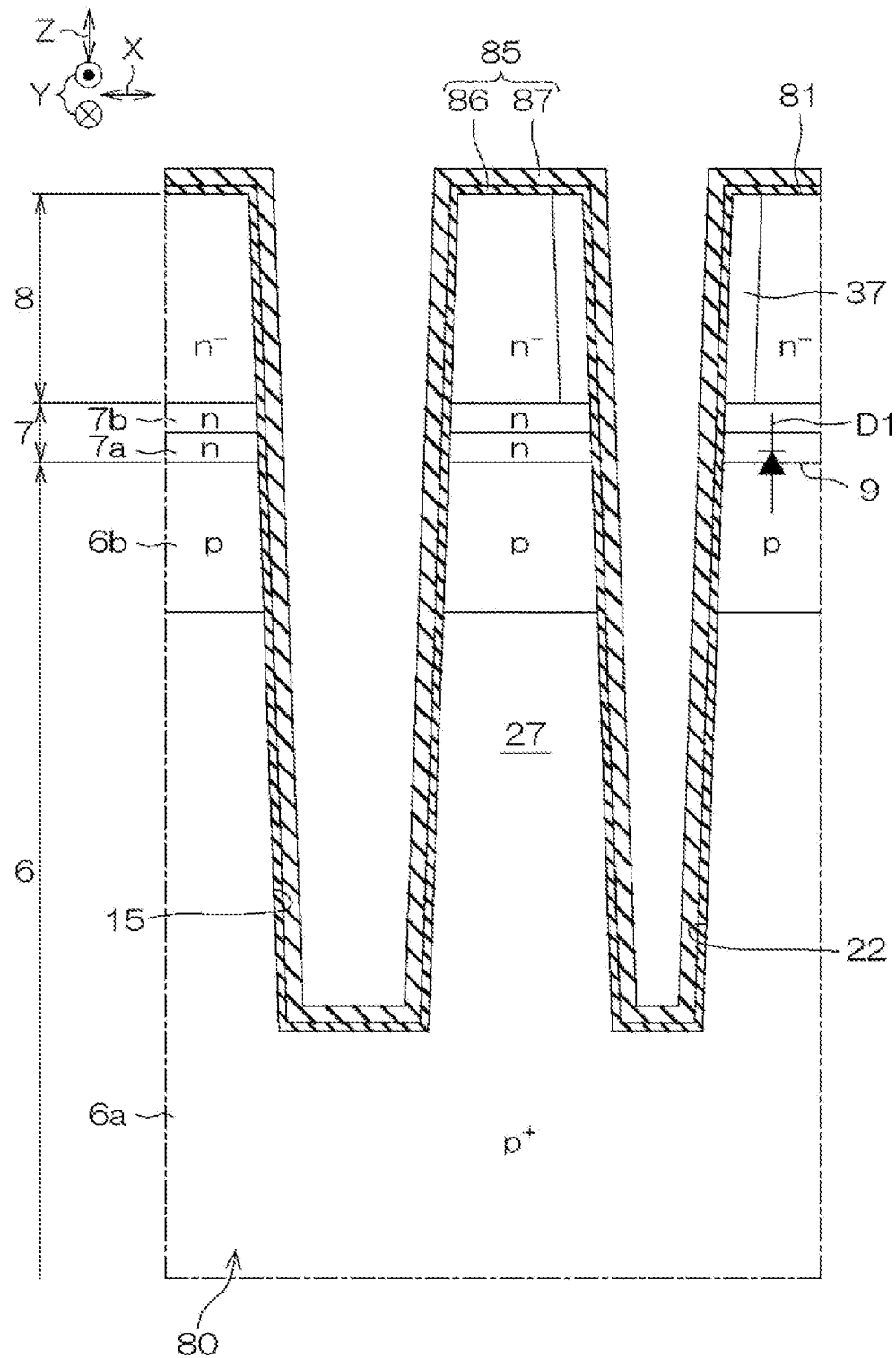
FIG. 7E is a cross-sectional view showing a step subsequent to the step shown in FIG. 7D.
Figure 7F:
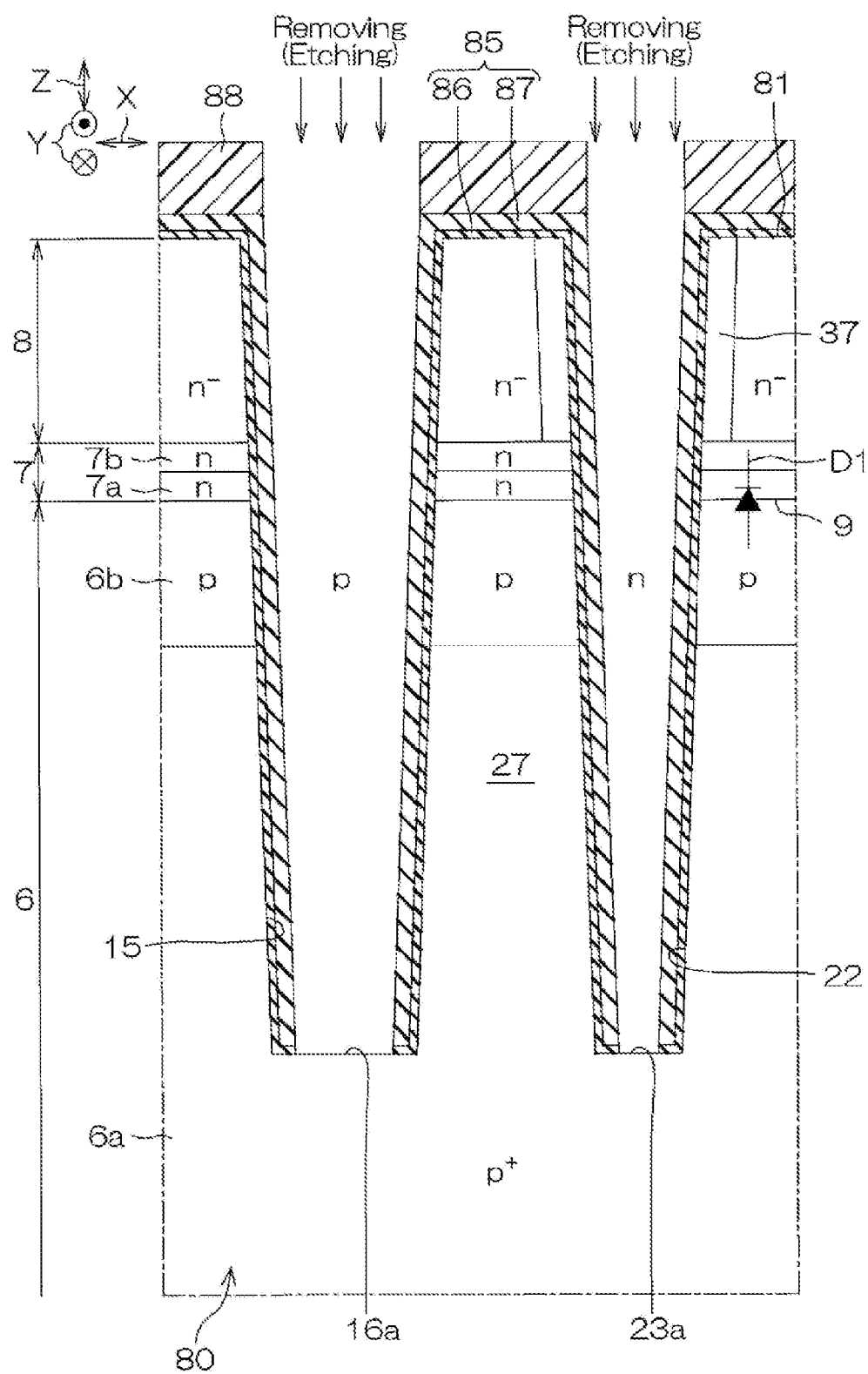
FIG. 7F is a cross-sectional view showing a step subsequent to the step shown in FIG. 7E.
Figure 7G:
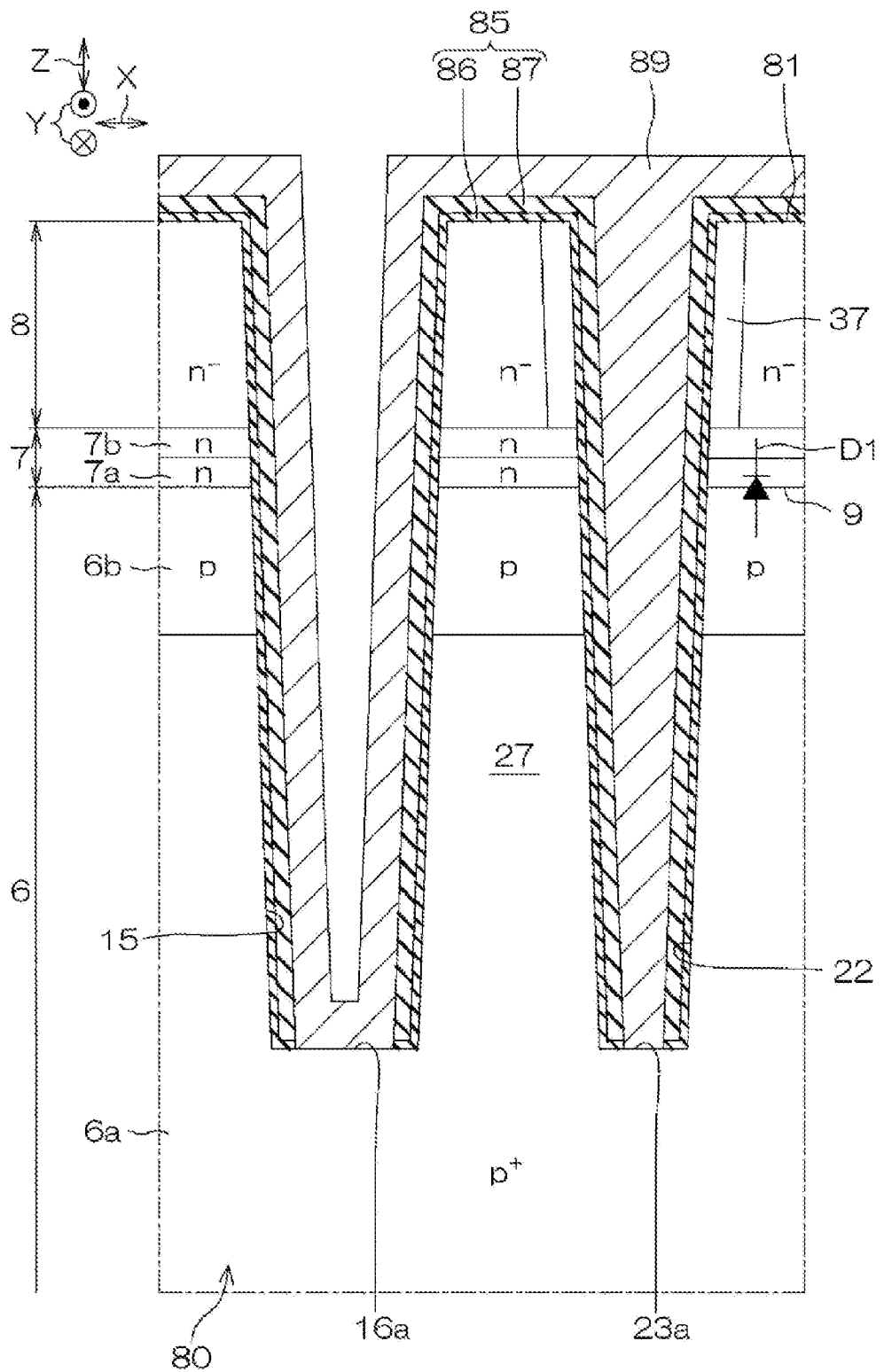
FIG. 7G is a cross-sectional view showing a step subsequent to the step shown in FIG. 7F.
Figure 7H:
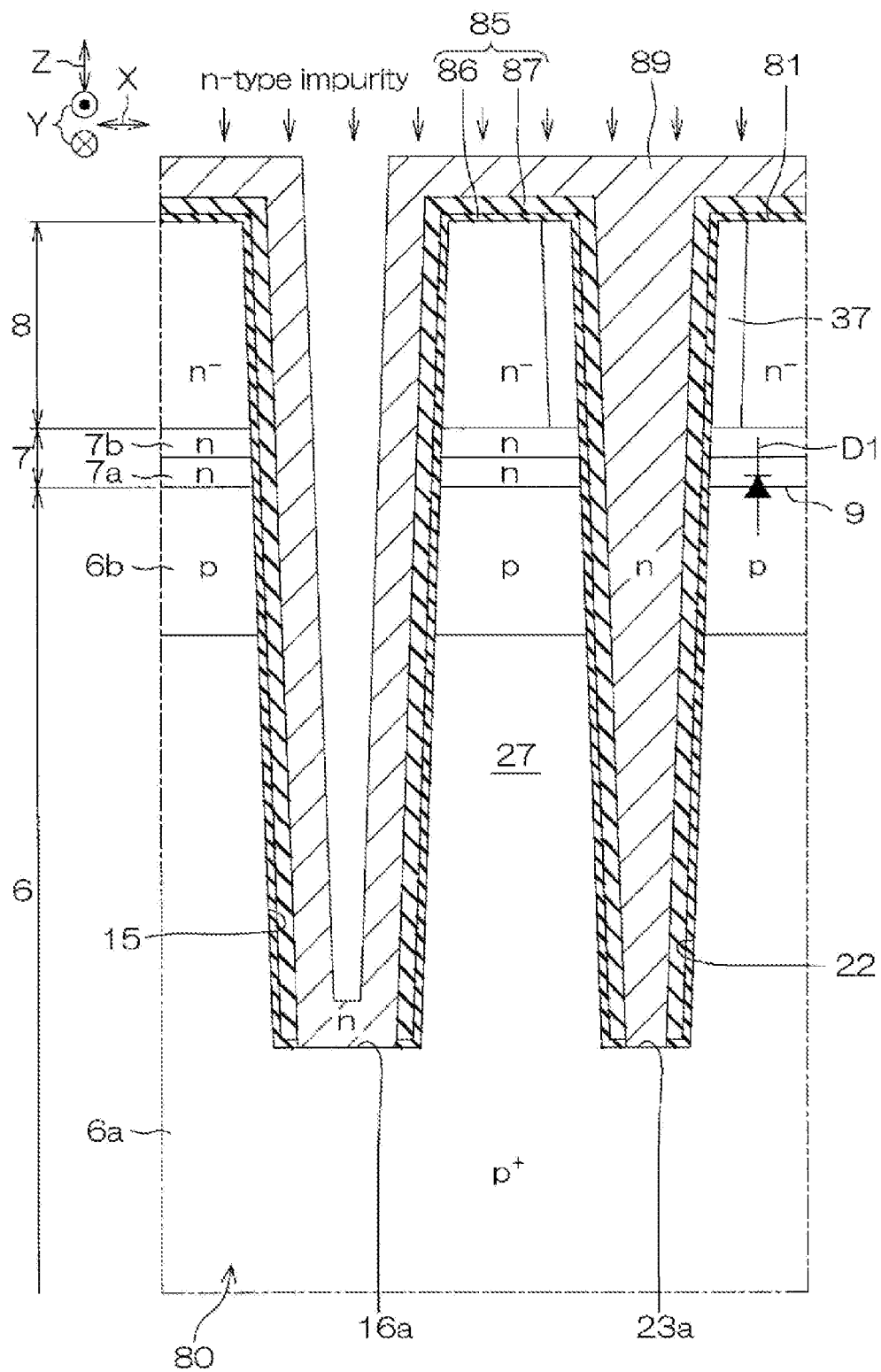
FIG. 7H is a cross-sectional view showing a step subsequent to the step shown in FIG. 7G.
Figure 7I:
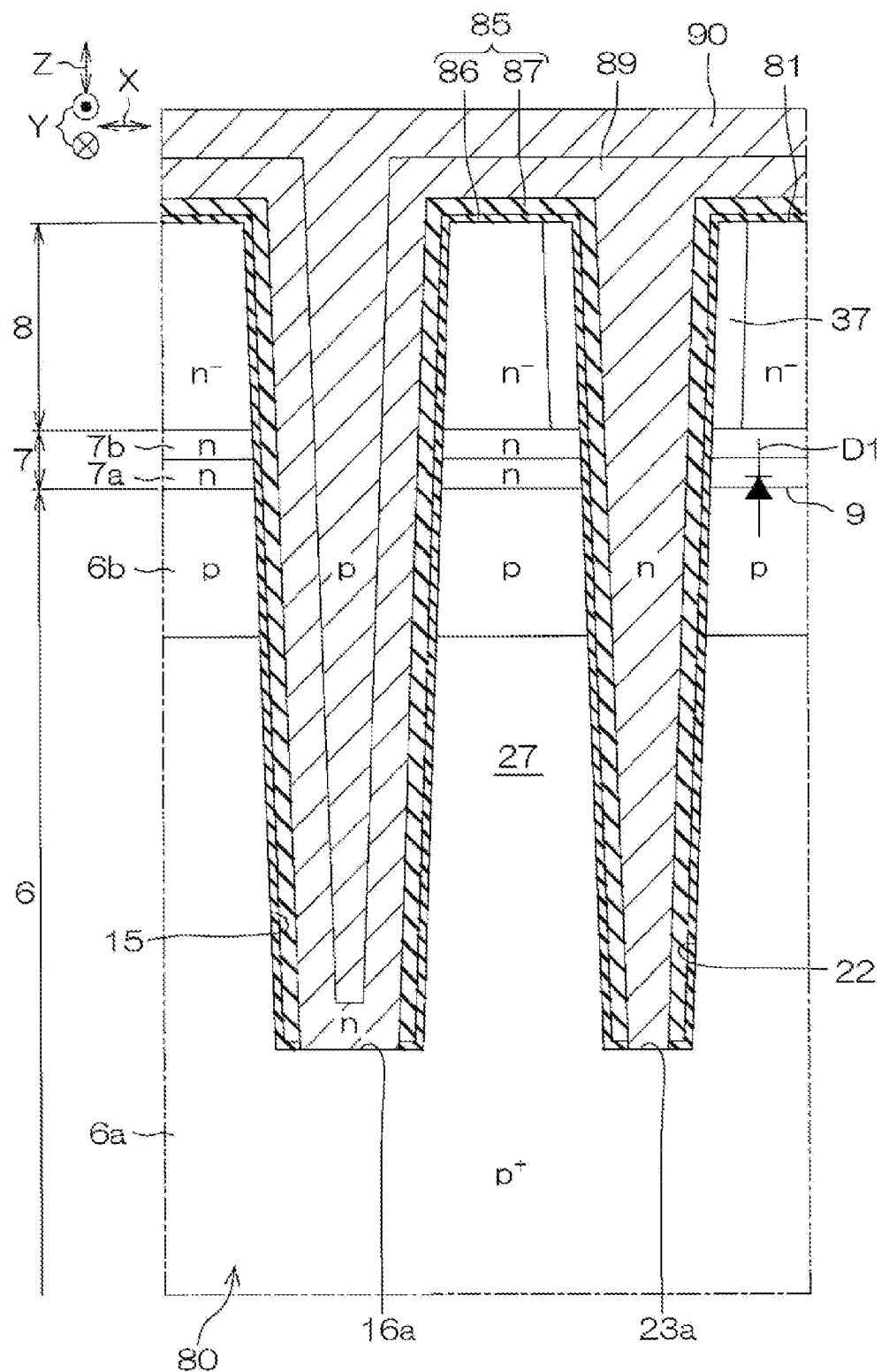
FIG. 7I is a cross-sectional view showing a step subsequent to the step shown in FIG. 7H.
Figure 7J:
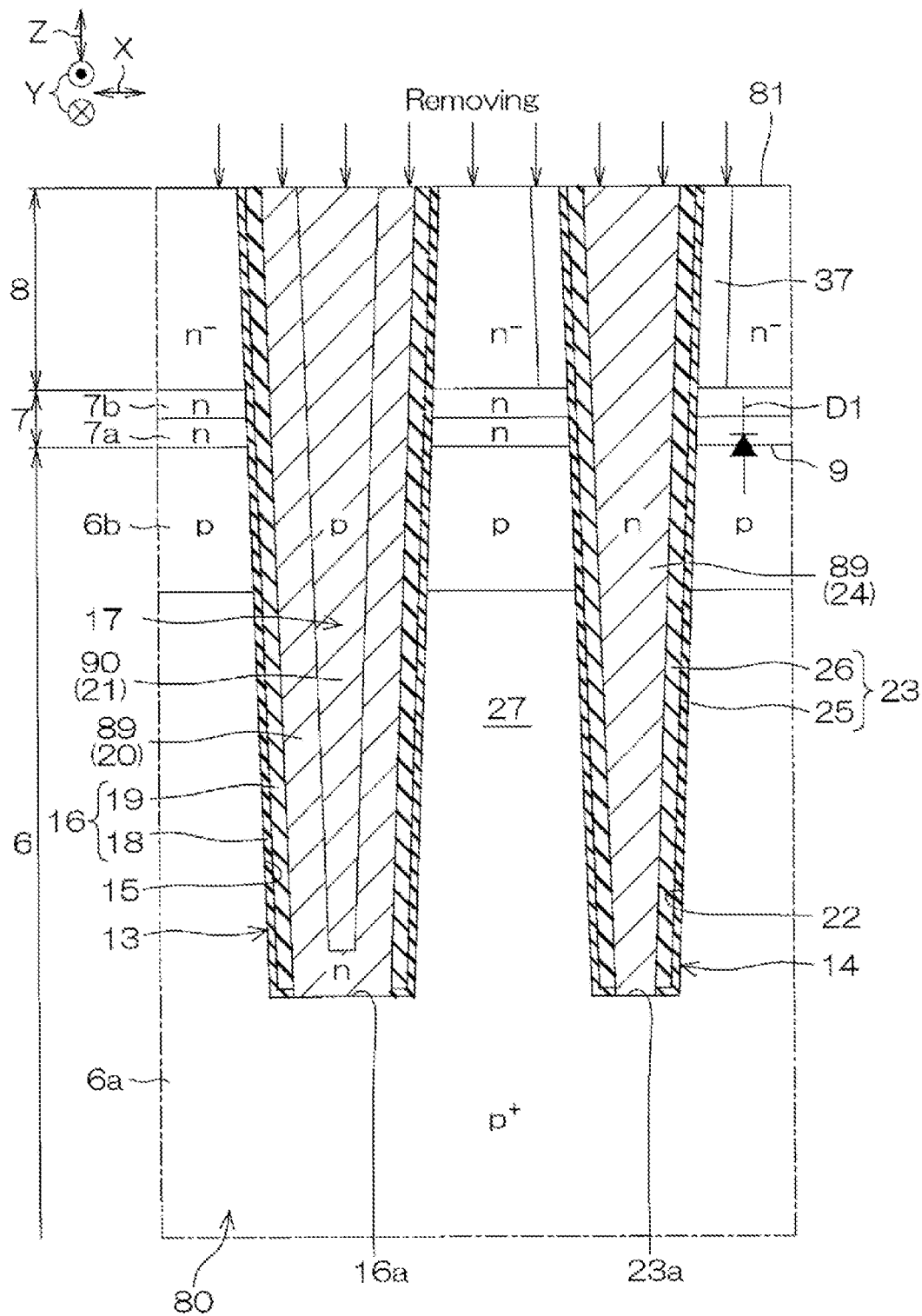
FIG. 7J is a cross-sectional view showing a step subsequent to the step shown in FIG. 7I.
Figure 7K:
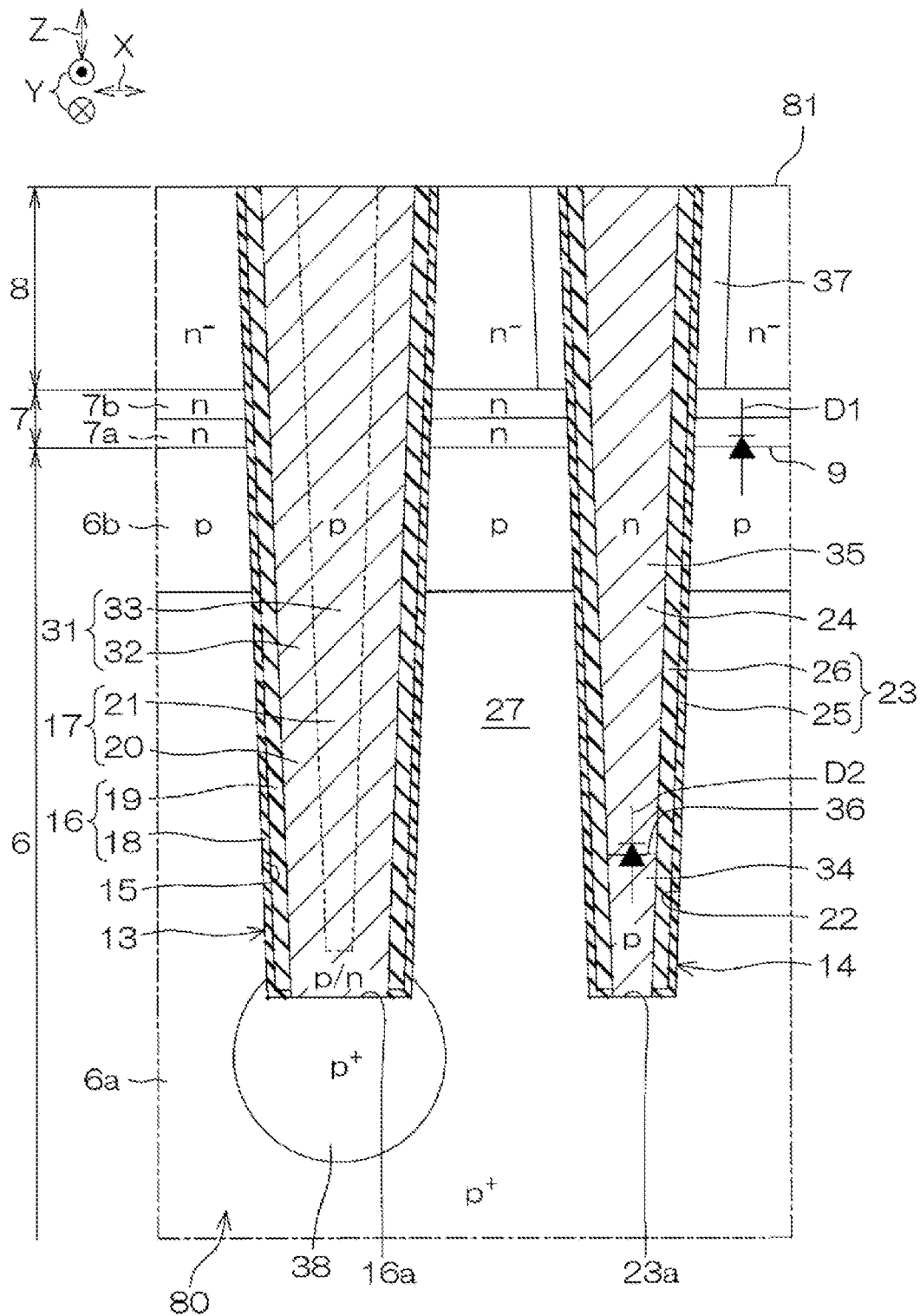
FIG. 7K is a cross-sectional view showing a step subsequent to the step shown in FIG. 7J.
Figure 7L:
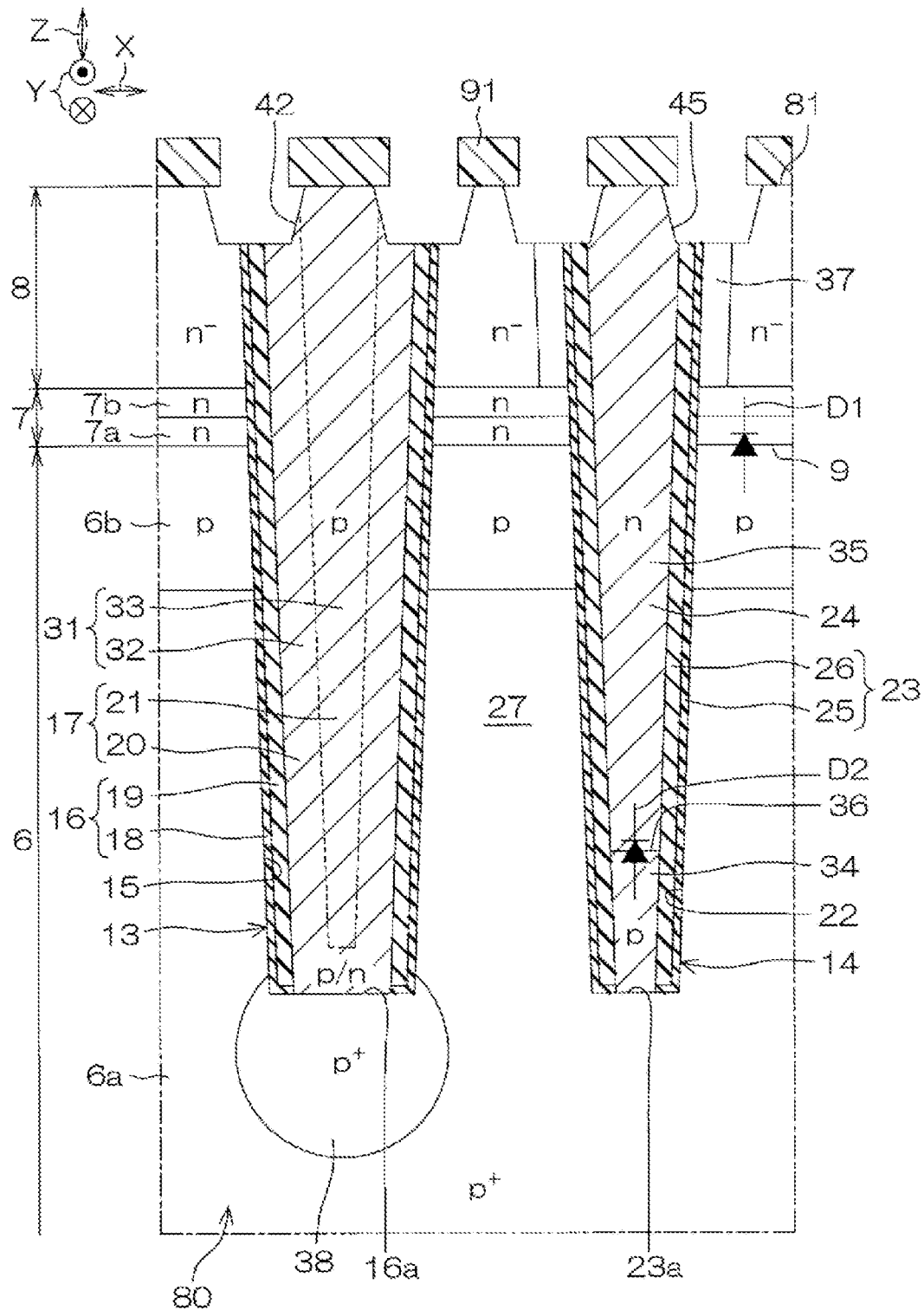
FIG. 7L is a cross-sectional view showing a step subsequent to the step shown in FIG. 7K.
Figure 7M:
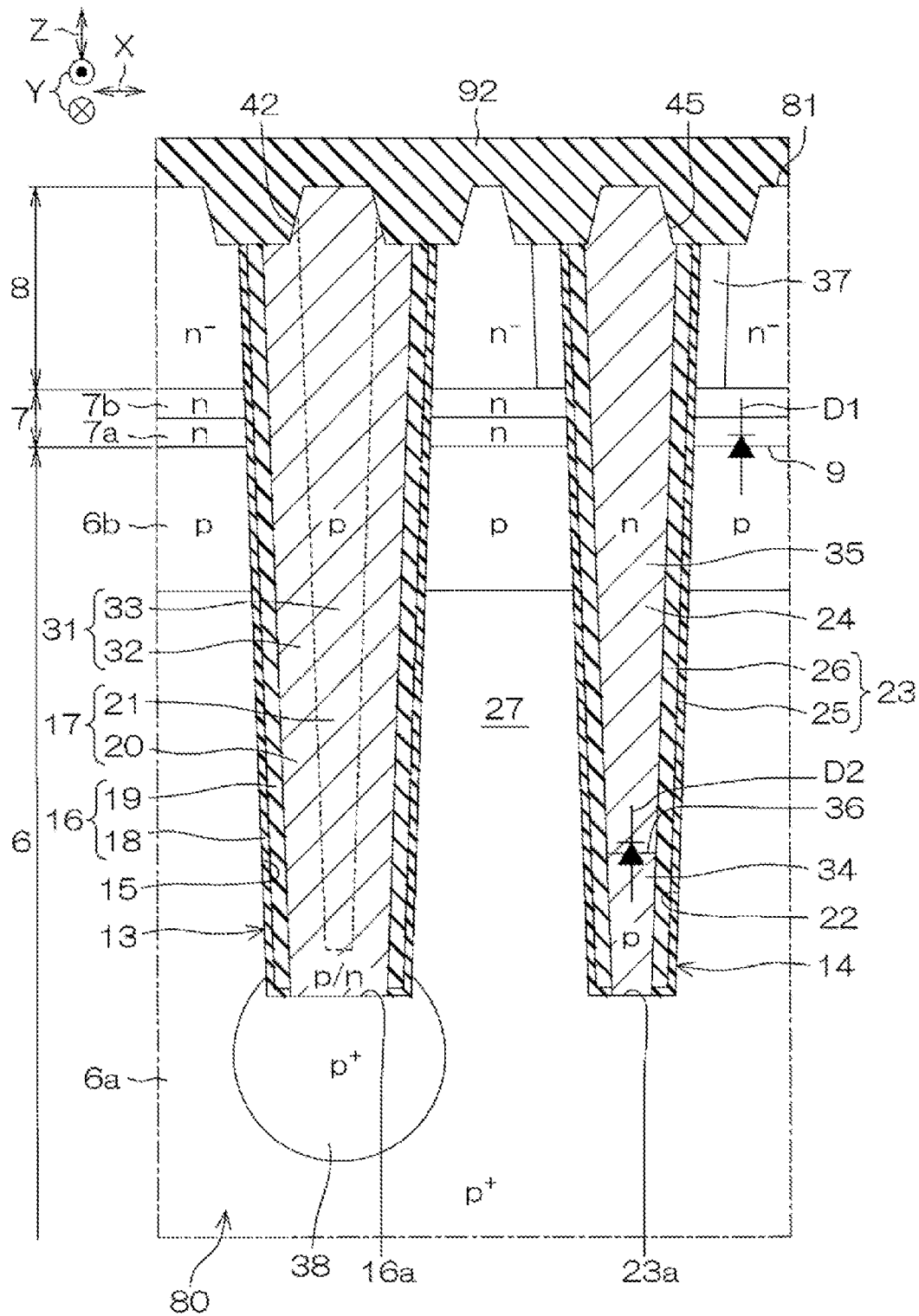
FIG. 7M is a cross-sectional view showing a step subsequent to the step shown in FIG. 7L.
Figure 7N:
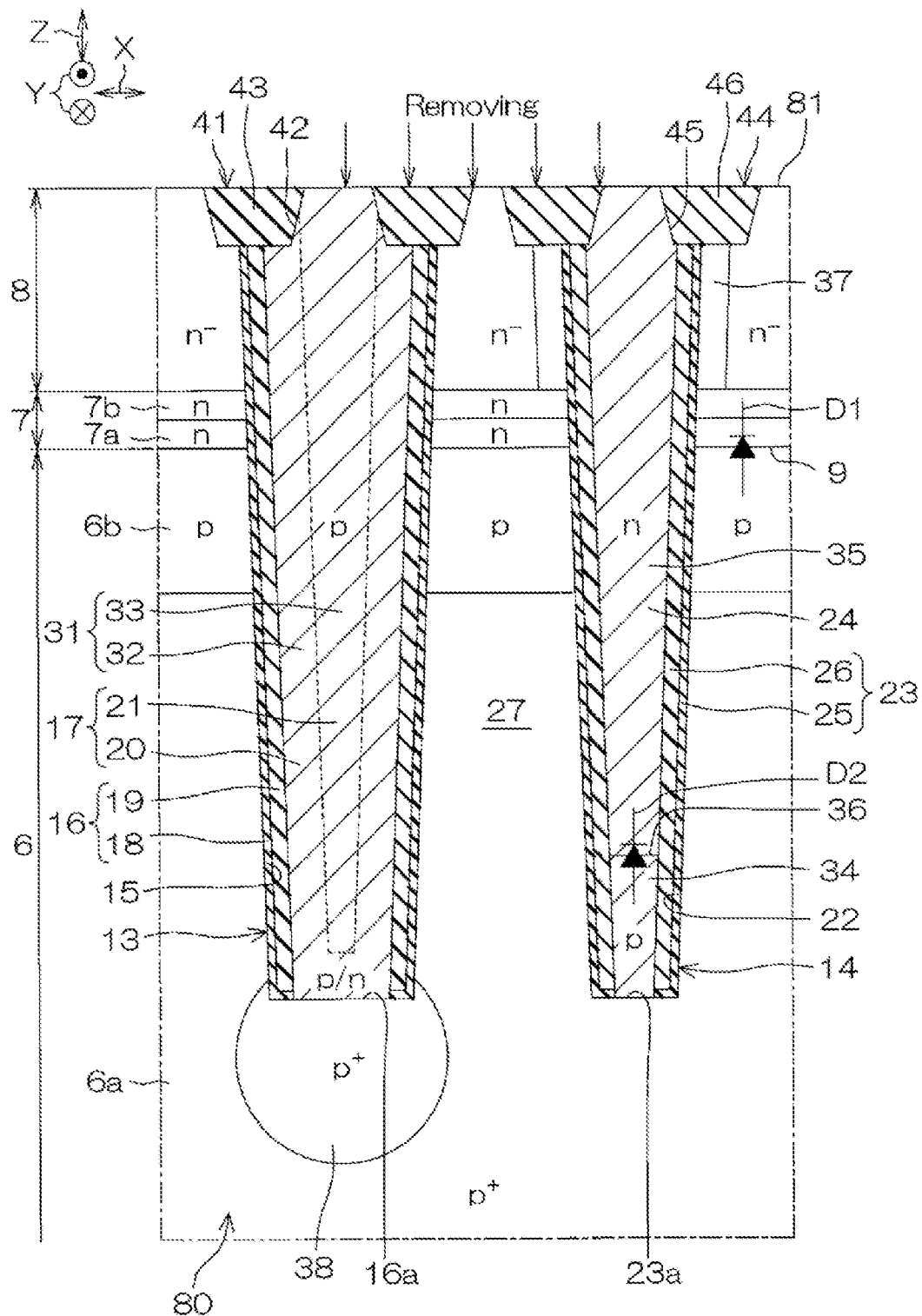
FIG. 7N is a cross-sectional view showing a step subsequent to the step shown in FIG. 7M.

FIGS. 7A to 7N are cross-sectional views showing an example of a method of manufacturing the semiconductor device 1A shown in FIG. 1. FIGS. 7A to 7N are cross-sectional views of portions corresponding to FIG. 4. A process of manufacturing the trench separation structure 12 and its peripheral structures is shown below. Referring to FIG. 7A, a disc-shaped epitaxial wafer 80 is prepared. The epitaxial wafer 80 has a wafer main surface 81. The epitaxial wafer 80 includes a first region 6, a second region 7, and a third region 8. The first region 6 includes a first high-concentration region 6a and a first low-concentration region 6b. The first high-concentration region 6a is formed of a p-type wafer. The first low-concentration region 6b is formed of a p-type epitaxial layer stacked on the wafer by an epitaxial growth method.

The second region 7 includes a second low-concentration region 7a and a second high-concentration region 7b. The second low-concentration region 7a is formed of an n-type epitaxial layer stacked on the first low-concentration region 6b by an epitaxial growth method. The second high-concentration region 7b is formed of an n-type epitaxial layer stacked on the second low-concentration region 7a by an epitaxial growth method. The third region 8 is formed of an n-type epitaxial layer stacked on the second high-concentration region 7b by an epitaxial growth method.

Next, referring to FIG. 7B, a first mask 82 having a predetermined pattern is formed on the wafer main surface 81. The first mask 82 exposes regions on the wafer main surface 81 where a first trench 15 and a second trench 22 are to be formed, and covers the other regions. Next, the epitaxial wafer 80 is selectively removed by an etching method via the first mask 82. The etching method may be a dry etching method and/or a wet etching method. In this step, the first trench 15 and the second trench 22, which expose at least the third region 8 and do not expose the first region 6, are formed. The width of the second trench 22 is less than the width of the first trench 15. Thereafter, the first mask 82 is removed.

Next, referring to FIG. 7C, a second mask 83 having a predetermined pattern is formed on the wafer main surface 81. The second mask 83 exposes the second trench 22 and covers the other regions. Next, n-type impurities are introduced into the wall surface of the second trench 22 by an ion implantation method via the second mask 83. As a result, an n-type sinker region 37 along the wall surface of the second trench 22 is formed in the third region 8. After that, the second mask 83 is removed.

Next, referring to FIG. 7D, a third mask 84 having a predetermined pattern is formed on the wafer main surface 81. The third mask 84 exposes regions on the wafer main surface 81 where the first trench 15 and the second trench 22 are to be formed, and covers the other regions. Next, the epitaxial wafer 80 is selectively removed by an etching method via the third mask 84, and the first trench 15 and the second trench 22 are further dug down. The first trench 15 and the second trench 22 penetrate the third region 8 and the second region 7 and are dug down to the first region 6. It is desirable that the etching method is a RIE (Reactive Ion Etching) method as an example of a dry etching method. Thereafter, the third mask 84 is removed.

Next, referring to FIG. 7E, a base insulating film 85, which is a base of a first insulating film 16 and a second insulating film 23, is formed on the wafer main surface 81. This step includes a step of forming a lower base insulating film 86 and an upper base insulating film 87 in this order from the wafer main surface 81 side. The lower base insulating film 86 serves as a base for a first lower insulating film 18 of the first insulating film 16 and a second lower insulating film 25 of the second insulating film 23. The lower base insulating film 86 may be formed by an oxidation process method (for example, a thermal oxidation process method). The upper base insulating film 87 may be formed by a CVD (Chemical Vapor Deposition) method. The base insulating film 85, which includes the lower base insulating film 86 and the upper base insulating film 87 having a density different from that of the lower base insulating film 86, is formed.

Next, referring to FIG. 7F, a fourth mask 88 having a predetermined pattern is formed on the base insulating film 85. The fourth mask 88 exposes portions of the base insulating film 85 which cover the first trench 15 and the second trench 22, and covers the other regions. Next, portions of the base insulating film 85, which cover the bottom wall of the first trench 15 and the bottom wall of the second trench 22, are removed by an etching method via the fourth mask 88.

It is desirable that the etching method is an anisotropic etching method. The etching method may be, for example, a RIE method as an example of a dry etching method. As a result, a first removing portion 16a, which exposes the bottom wall of the first trench 15, and a second removing portion 23a, which exposes the bottom wall of the second trench 22, are formed. In this step, the first removing portion 16a, which exposes the lower end portion of the side wall of the first trench 15, may be formed. Further, the second removing portion 23a, which exposes the lower end portion of the side wall of the second trench 22, may be formed. Thereafter, the fourth mask 88 is removed.

Next, referring to FIG. 7G, a first polysilicon film 89, which is a base of the first portion 20 of the first polysilicon 17 and the second polysilicon 24, is formed on the base insulating film 85. In this embodiment, the first polysilicon film 89 is formed of non-doped polysilicon of no impurity addition. The first polysilicon film 89 may be formed by a CVD method. The first polysilicon film 89 is formed on the base insulating film 85 in a film shape along the wafer main surface 81, the wall surface of the first trench 15, and the wall surface of the second trench 22.

The first polysilicon film 89 backfills the entire second trench 22 and partitions a recess space in the first trench 15. The first polysilicon film 89 does not need to completely backfill the second trench 22 and may be formed on the wall surface of the second trench 22 in a film shape so as to partition the recess space.

Next, referring to FIG. 7H, n-type impurities (pentavalent element) are introduced into the first polysilicon film 89 by an ion implantation method. As a result, the n-type conduction type is imparted to the first polysilicon film 89. When the first polysilicon film 89 partitions the recess space in the second trench 22, the first polysilicon film 89 may be formed again so as to be buried in the recess space in the second trench 22 before the step of introducing the n-type impurities or after the step of introducing the n-type impurity. Of course, the first polysilicon film 89 may be formed of doped polysilicon with n-type impurity added. In this case, the step of FIG. 7H may be omitted.

Next, referring to FIG. 7I, a second polysilicon film 90, which is a base of the second portion 21 of the first polysilicon 17, is formed on the first polysilicon film 89. In this embodiment, the first polysilicon film 89 is formed of doped polysilicon into which p-type impurities (trivalent element) are introduced. The first polysilicon film 89 may be formed by a CVD method. The second polysilicon film 90 is formed on the first polysilicon film 89 in a film shape along the wafer main surface 81 and the wall surface of the first trench 15. The second polysilicon film 90 backfills the recess space partitioned by the first polysilicon film 89 in the first trench 15.

Next, referring to FIG. 7J, the first polysilicon film 89 and the second polysilicon film 90 are selectively removed. This step includes a step of removing the second polysilicon film 90, the first polysilicon film 89, and the base insulating film 85 until the epitaxial wafer 80 (the third region 8) is exposed by a grinding method. The grinding method may be a CMP (Chemical Mechanical Polishing) method. As a result, the first insulating film 16 and the first polysilicon 17 are formed in the first trench 15, and the second insulating film 23 and the second polysilicon 24 are formed in the second trench 22. Of course, in this step, an etching method (wet etching method and/or dry etching method) may be adopted instead of the grinding method.

Next, referring to FIG. 7K, the p-type impurities in the first polysilicon 17 are diffused into the first polysilicon 17 by a heating process method (drive-in process method) for the epitaxial wafer 80. By this step, the conduction type of the first portion 20 in the first polysilicon 17 is replaced with the p type from the n type. As a result, a p-type first impurity region 31 is formed in the entire region inside the first polysilicon 17.

Further, in this step, the n-type impurities in the second polysilicon 24 are diffused into the second polysilicon 24. Further, in this step, the p-type impurities (trivalent elements) of the first region 6 (the first high-concentration region 6a) are diffused to the lower end portion of the second polysilicon 24 via the bottom wall of the second trench 22. As a result, a p-type second impurity region 34 is formed in a region on the lower end portion side of the second polysilicon 24, and an n-type third impurity region 35 is formed in a region on the upper end portion side of the second polysilicon 24. Further, in this step, the p-type impurities in the first polysilicon 17 are diffused into the first region 6 via the bottom wall of the first trench 15. As a result, a p-shaped bottom wall region 38 having a higher concentration than the first region 6 is formed in a region along the bottom wall of the first trench 15 in the first region 6.

Next, referring to FIG. 7L, a fifth mask 91 having a predetermined pattern is formed on the wafer main surface 81. The fifth mask 91 exposes regions on the wafer main surface 81 where a plurality of first shallow trenches 42, a plurality of second shallow trenches 45, and a plurality of third shallow trenches 61 are to be formed, and covers the other regions. Next, the epitaxial wafer 80, the first insulating film 16, the first polysilicon 17, the second insulating film 23, and the second polysilicon 24 are selectively removed by an etching method (wet etching method and/or dry etching method) via the fifth mask 91. As a result, the plurality of first shallow trenches 42, the plurality of second shallow trenches 45, and the plurality of third shallow trenches 61 are formed. Thereafter, the fifth mask 91 is removed.

Next, referring to FIG. 7M, a base buried insulating film 92, which is a base of a plurality of first buried insulators 43, a plurality of second buried insulators 46, and a plurality of third buried insulators 62, is formed on the wafer main surface 81. The base buried insulating film 92 may be formed by a CVD method.

Next, referring to FIG. 7N, an unnecessary portion of the base buried insulating film 92 is removed. In this step, the unnecessary portion of the base buried insulating film 92 is removed by a grinding method until the epitaxial wafer 80 (the third region 8) is exposed. The grinding method may be a CMP method. As a result, the plurality of first buried insulators 43, the plurality of second buried insulators 46, and the plurality of third buried insulators 62 are formed. Of course, the unnecessary portion of the base buried insulating film 92 may be removed by an etching method (wet etching method and/or dry etching method) instead of the grinding method. The semiconductor device 1A is formed by the steps including the above.

Figure 8:
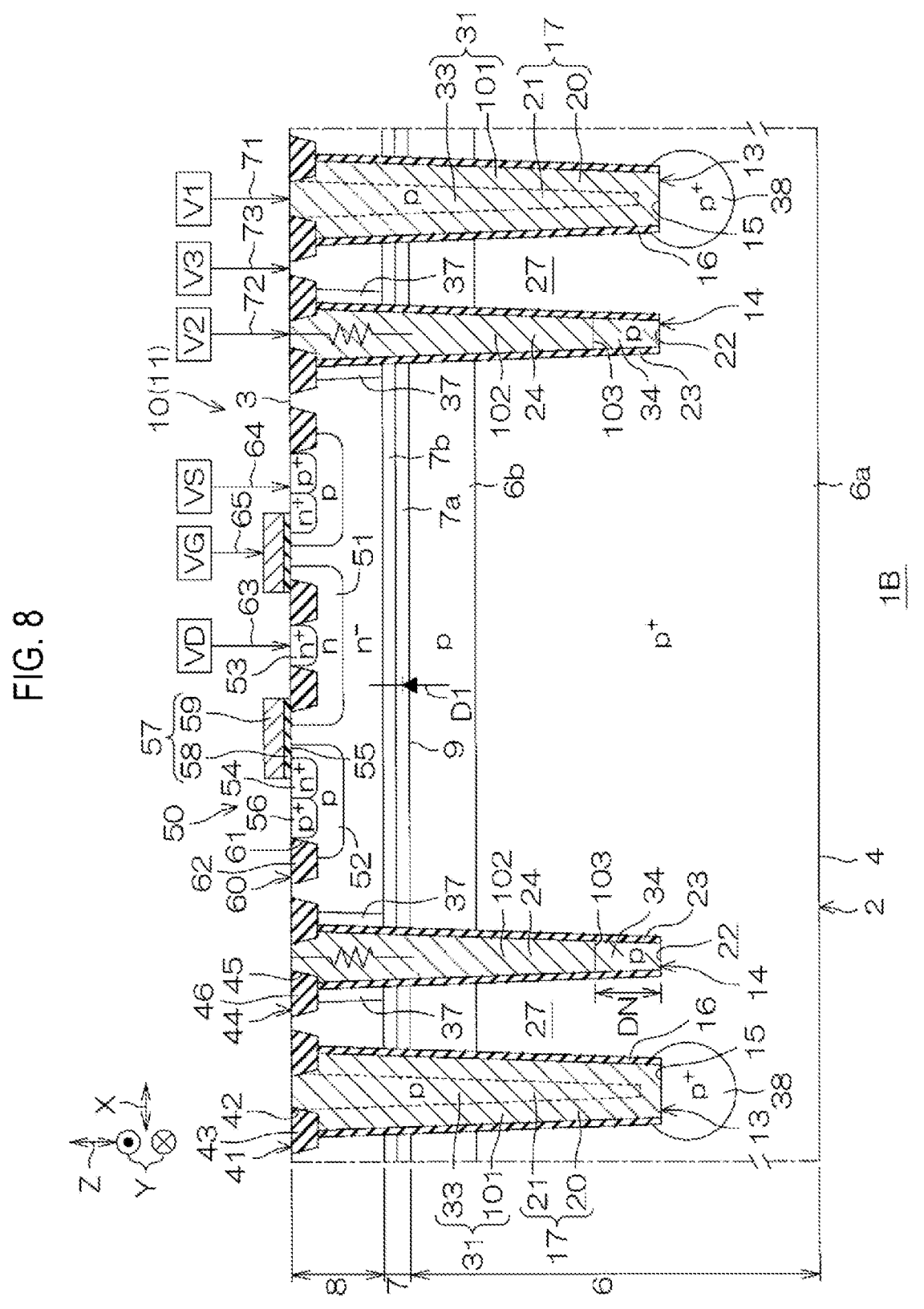

FIG. 8 is a cross-sectional view showing a semiconductor device 1B according to a second embodiment. Referring to FIG. 8, the semiconductor device 1B includes a first concentration portion 101 in place of the first concentration portion 32 in the first impurity region 31. Like the first concentration portion 32, the first concentration portion 101 has a relatively low p-type impurity concentration and is formed on the peripheral portion of the first polysilicon 17. In this embodiment, the first concentration portion 101 contains only p-type impurities (trivalent element) and does not contain n-type impurities (pentavalent element). Of course, the first concentration portion 101 may contain n-type impurities.

The semiconductor device 1B includes a resistance region 102 in place of the third impurity region 35 in the second polysilicon 24. The resistance region 102 may be regarded as a constituent element of the second trench structure 14. The resistance region 102 has an impurity concentration lower than that of the second impurity region 34 and has a resistance value larger than that of the second impurity region 34. Further, the resistance region 102 has an impurity concentration lower than that of the first impurity region 31 and has a resistance value larger than that of the first impurity region 31. In this embodiment, the resistance region 102 is formed of an impurity-free region of the second polysilicon 24.

The resistance region 102 is formed on the upper end portion side of the second polysilicon 24 with respect to the second impurity region 34 in a cross-sectional view. The resistance region 102 is located within a thickness range between the second impurity region 34 and the first pn-junction portion 9 in a cross-sectional view and is electrically connected to the second impurity region 34. It is desirable that the resistance region 102 is electrically connected to the second impurity region 34 in a region on the bottom wall side of the second trench 22 (that is, a region on the lower end portion side of the second polysilicon 24) with respect to the depth position of the first pn-junction portion 9.

It is desirable that the resistance region 102 is formed so as to cross the depth position of the first pn-junction portion 9 in a cross-sectional view. In this embodiment, the resistance region 102 is formed within a thickness range between the upper end portion of the second poly silicon 24 and the second impurity region 34 so as to be exposed from the upper end portion of the second polysilicon 24 in a cross-sectional view. The resistance region 102 faces the first region 6, the second region 7, and the third region 8 with the second insulating film 23 interposed therebetween.

That is, the resistance region 102 is electrically insulated from the first region 6, the second region 7, and the third region 8 by the second insulating film 23. The resistance region 102 is formed in a strip shape extending along the second polysilicon 24 in a plan view. Specifically, the resistance region 102 is formed in an annular shape (square annular shape in this embodiment) extending along the second polysilicon 24 in a plan view. That is, the resistance region 102 is formed in the entire region on the upper end side of the second polysilicon 24 in a plan view and in a cross-sectional view.

The semiconductor device 1B includes a node portion 103 formed in the middle portion of the second polysilicon 24 in the thickness direction. The node portion 103 may be regarded as a constituent element of the second trench structure 14. The node portion 103 is a connection portion between the second impurity region 34 and the resistance region 102. That is, the resistance region 102 is formed in the second polysilicon 24 so as to form the second impurity region 34 and the node portion 103. The node portion 103 is located in a region on the bottom wall side of the second trench 22 with respect to the depth position of the first pn-junction portion 9. Further, the node portion 103 is formed in a thickness range facing the first high-concentration region 6a of the first region 6 with the second insulating film 23 interposed therebetween.

It is desirable that a distance DN between the node portion 103 and the bottom wall of the second trench 22 (that is, a thickness of the second impurity region 34) is less than the distance D between the first main surface 3 and the first pn-junction portion 9 (DN<D) (see also FIG. 4). It is desirable that the distance DN is less than a distance between the first pn-junction portion 9 and the node portion 103. It is desirable that the distance DN is ½ or less of the second protrusion amount P2 of the second trench structure 14 (DN≤½×P2). It is desirable that the distance DN is ½ or less of the first protrusion amount P1 of the first trench structure 13 (DN≤(½)×P1). The distance DN may be less than the third width W3 of the mesa portion 27 (DN<W3).

The application conditions of the first to third potentials V1 to V3 are the same as in the case of the first embodiment.

The first impurity region 31, the second impurity region 34, and the resistance region 102 according to the semiconductor device 1B are formed by forming the first poly silicon film 89 formed of poly silicon having a relatively low-impurity concentration (p-type impurity concentration or n-type impurity concentration) or non-doped poly silicon of no impurity addition in the above-described step of FIG. 7G, and then omitting the step of FIG. 7H. As described above, the semiconductor device 1B also produces the same effects as those described for the semiconductor device 1A.

Figure 9:
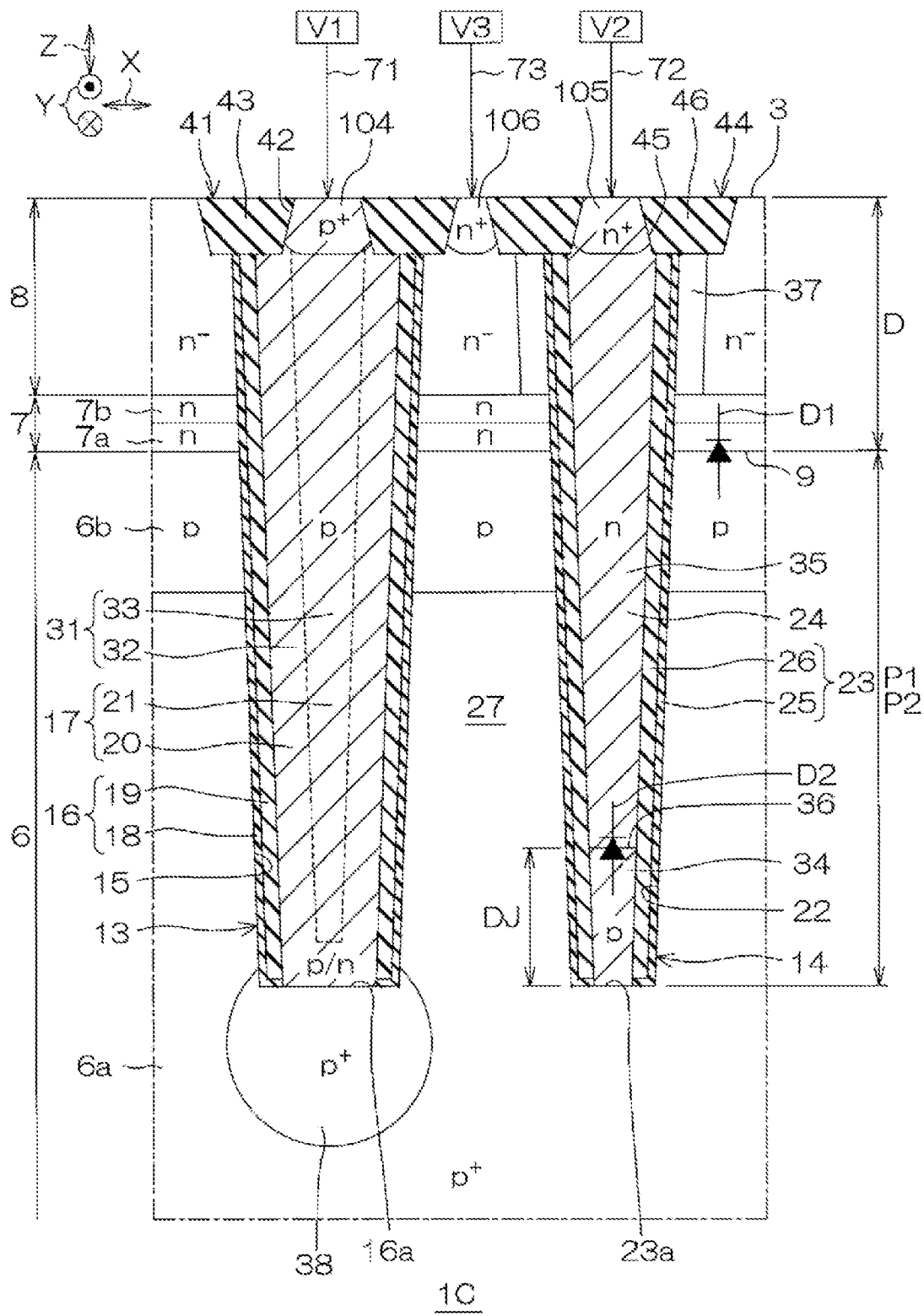
FIG. 9 is a cross-sectional view showing a semiconductor device according to a third embodiment.

FIG. 9 is a cross-sectional view showing a semiconductor device 1C according to a third embodiment. FIG. 9 is a cross-sectional view of a portion corresponding to FIG. 4. Referring to FIG. 9, the semiconductor device 1C includes a p-type first contact region 104 formed on the surface layer portion on the upper end portion side of the first polysilicon 17. The first contact region 104 has a higher p-type impurity concentration than the first impurity region 31 (the second concentration portion 33). It is desirable that the first contact region 104 is desirably formed at an interval from the depth position of the second region 7 (the bottom portion of the third region 8) to the first main surface 3 side.

The semiconductor device 1C includes an n-type second contact region 105 formed on the surface layer portion on the upper end portion side of the second polysilicon 24. The second contact region 105 has a higher n-type impurity concentration than the third impurity region 35. It is desirable that the second contact region 105 is formed at an interval from the depth position of the second region 7 (the bottom portion of the third region 8) to the first main surface 3 side.

The semiconductor device 1C includes an n-type third contact region 106 formed on the surface layer portion of the mesa portion 27. The third contact region 106 has a higher n-type impurity concentration than the third region 8. It is desirable that the third contact region 106 is formed at an interval from the depth position of the second region 7 (the bottom portion of the third region 8) to the first main surface 3 side.

As described above, the semiconductor device 1C also produces the same effects as those described for the semiconductor device 1A. According to the semiconductor device 1C, the ohmic property of the first contact electrode 71 with respect to the first impurity region 31 can be enhanced by the first contact region 104. According to the semiconductor device 1C, the ohmic property of the second contact electrode 72 with respect to the third impurity region 35 can be enhanced by the second contact region 105. According to the semiconductor device 1C, the ohmic property of the third contact electrode 73 with respect to the mesa portion 27 can be enhanced by the third contact region 106.

The semiconductor device 1C may include at least one of the first to third contact regions 104 to 106 and does not need to include all of the first to third contact regions 104 to 106 at the same time. Further, at least one of the first to third contact regions 104 to 106 may be applied to the second embodiment.

Hereinafter, modifications that can be applied to the above-described first to third embodiments are shown with reference to FIGS. 10 to 14. The following modifications or the combined forms of the following modifications are appropriately applied to the above-described first to third embodiments.

Figure 10:
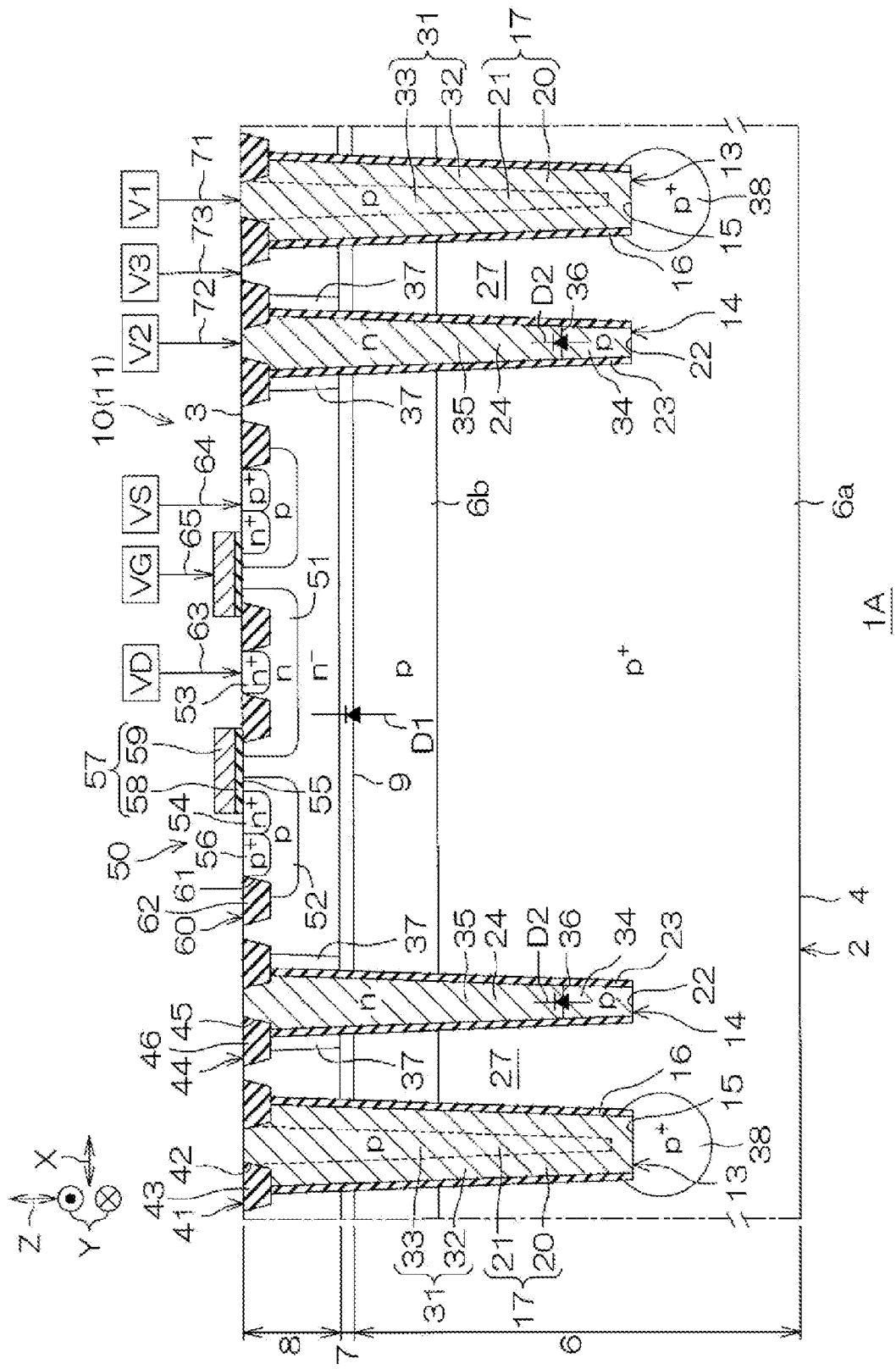
FIG. 10 is a cross-sectional view showing a second region according to a first modification.

FIG. 10 is a cross-sectional view showing a second region 7 according to a first modification. Here, although an example in which the second region 7 according to the first modification is applied to the first embodiment is shown, the second region 7 according to the first modification can also be applied to the second and third embodiments. Referring to FIG. 10, the second region 7 according to the first modification may have a single-layer structure including any one of the second low-concentration region 7a and the second high-concentration region 7b. Even with such a structure, the same effects as those described for the semiconductor device 1A can be obtained.

Figure 11:
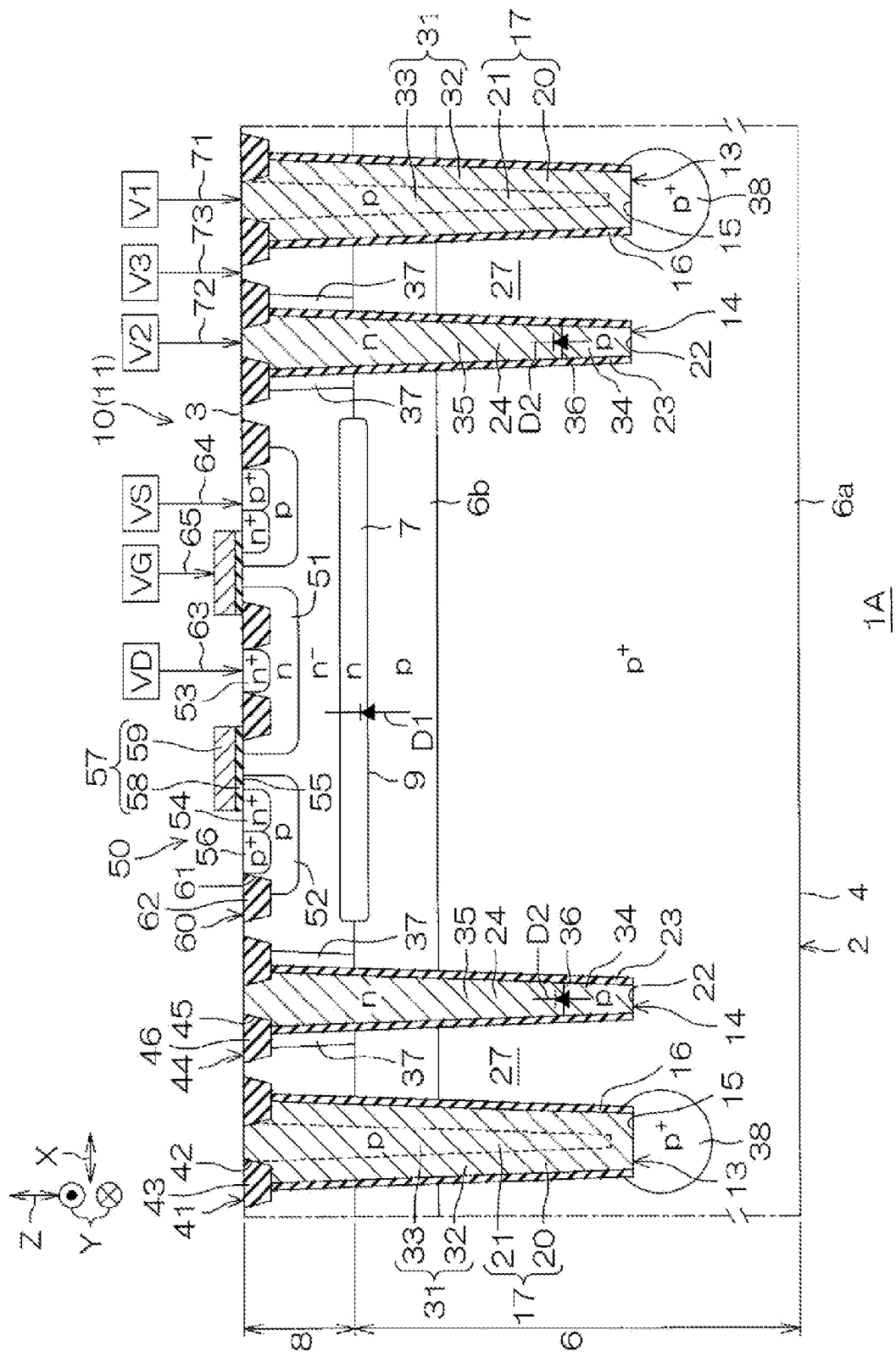
FIG. 11 is a cross-sectional view showing a second region according to a second modification.

FIG. 11 is a cross-sectional view showing a second region 7 according to a second modification. Here, although an example in which the second region 7 according to the second modification is applied to the first embodiment is shown, the second region 7 according to the second modification can also be applied to the second and third embodiments. Referring to FIG. 11, the second region 7 according to the second modification is formed at an interval from the second trench structure 14 in a region surrounded by the second trench structure 14. That is, the second region 7 exposes the first region 6 in the region between a second trench structure 14 and an adjacent second trench structure 14.

The second region 7 may have a stacked structure including the second low-concentration region 7a and the second high-concentration region 7b, or may have a single-layer structure including any one of the second low-concentration region 7a and the second high-concentration region 7b. In this modification, the first pn-junction portion 9 is formed at a boundary portion between the first region 6 and the second region 7 and a boundary portion between the first region 6 and the third region 8. Even with such a structure, the same effects as those described for the semiconductor device 1A can be obtained.

Figure 12:
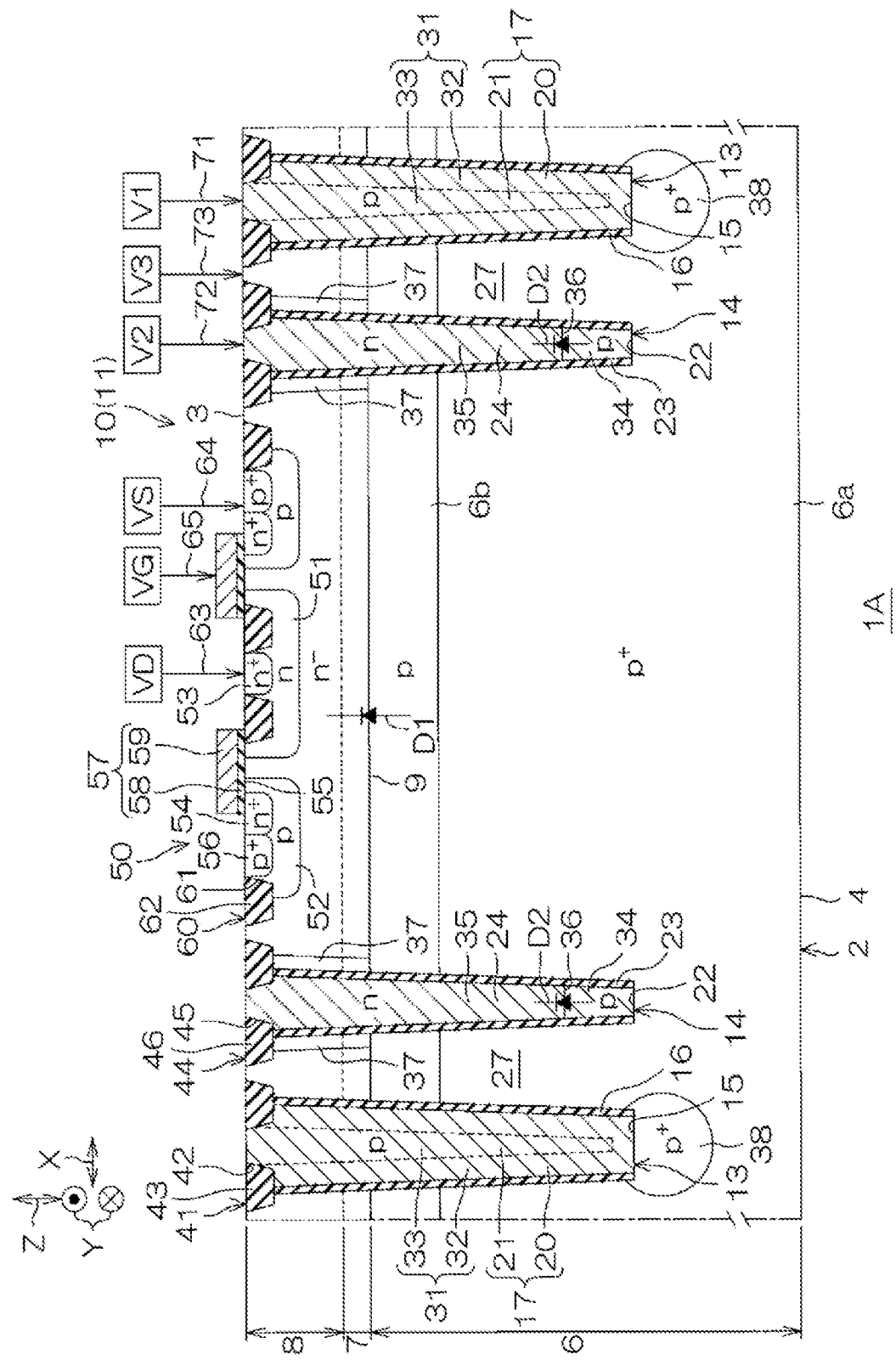
FIG. 12 is a cross-sectional view showing a second region according to a third modification.

FIG. 12 is a cross-sectional view showing a second region 7 according to a third modification. Here, although an example in which the second region 7 according to the third modification is applied to the first embodiment is shown, the second region 7 according to the third modification can also be applied to the second and third embodiments. Referring to FIG. 12, the second region 7 according to the third modification is formed as a portion of the third region 8. That is, the second region 7 according to the third modification is formed with the n-type impurity concentration of the third region 8. In other words, the third region 8 is formed with an n-type impurity concentration substantially equal to that of the second region 7. Even with such a structure, the same effects as those described for the semiconductor device 1A can be obtained.

Figure 13:
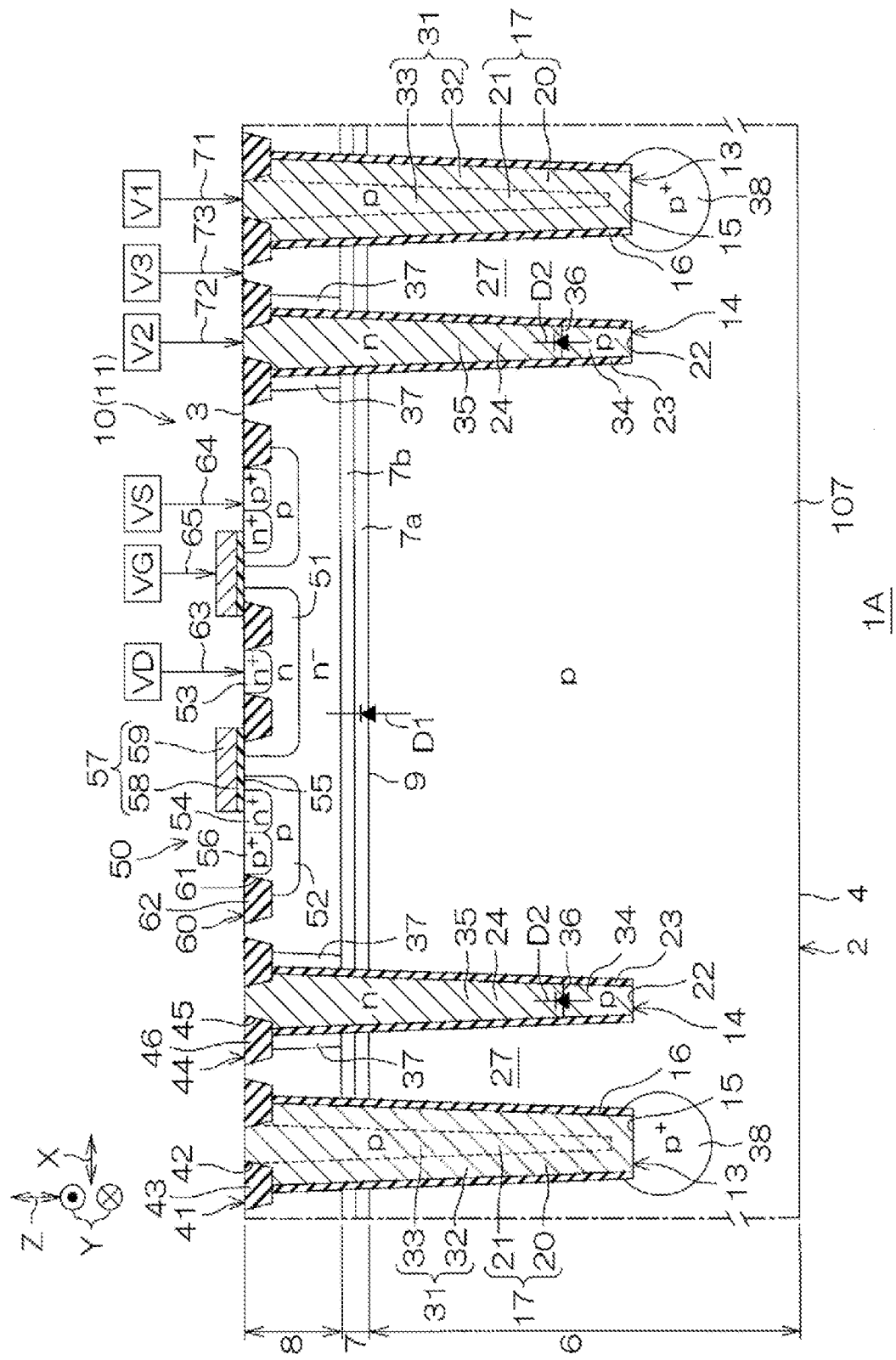
FIG. 13 is a cross-sectional view showing a first region according to a modification.

FIG. 13 is a cross-sectional view showing a first region 6 according to a modification. Here, although an example in which the first region 6 according to the modification is applied to the first embodiment is shown, the first region 6 according to the modification can also be applied to the second and third embodiments. Referring to FIG. 13, the first region 6 according to the modification has a single-layer structure formed of a p-type semiconductor substrate 107. Even with such a structure, the same effects as those described for the semiconductor device 1A can be obtained.

Figure 14:
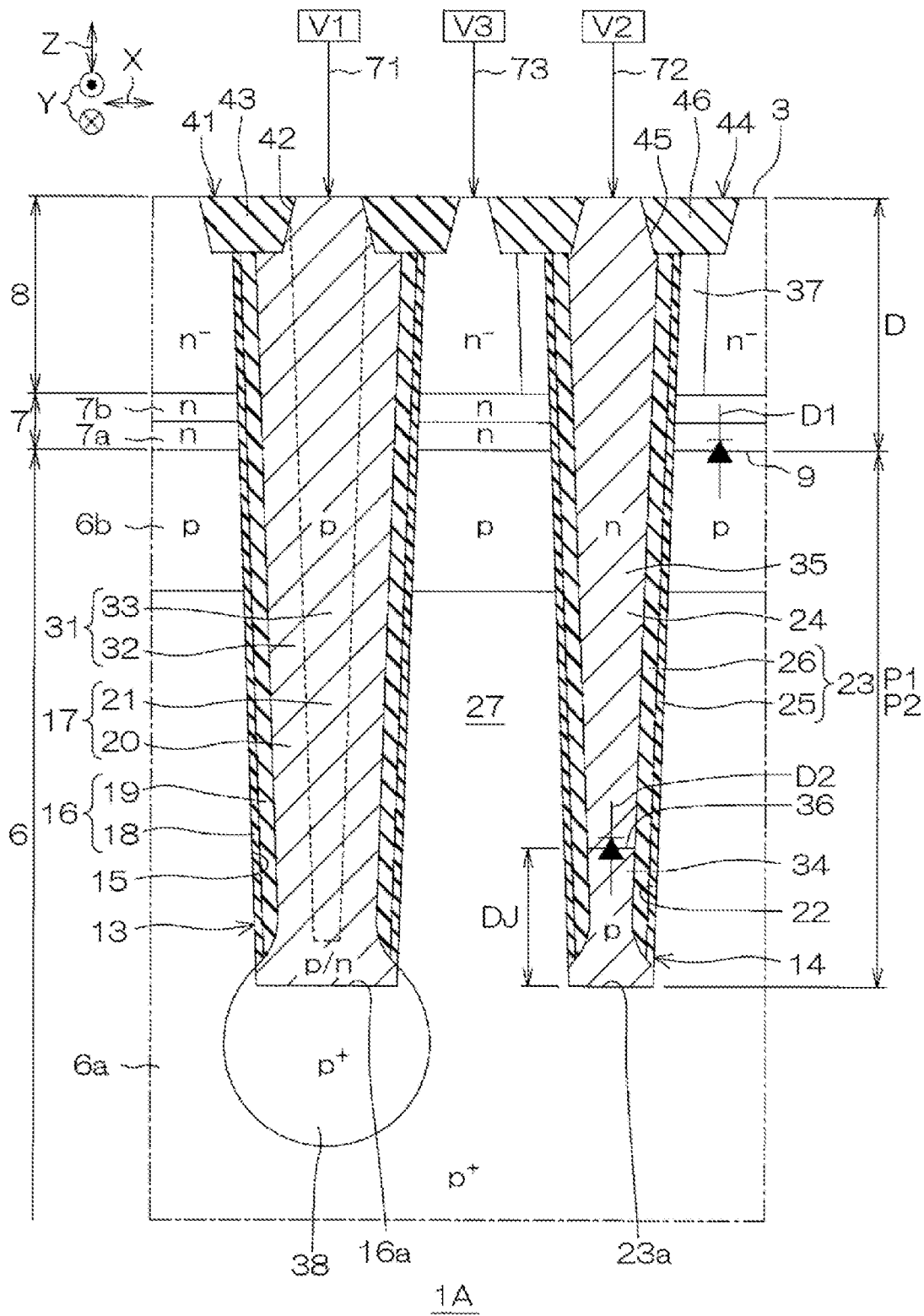
FIG. 14 is a cross-sectional view showing a first removing portion and a second removing portion according to a modification.

FIG. 14 is a cross-sectional view showing a first removing portion 16a and a second removing portion 23a according to a modification. Here, although an example in which the first removing portion 16a and the second removing portion 23a according to the modification are applied to the first embodiment is shown, the first removing portion 16a and the second removing portion 23a according to the modification can also be applied to the second and third embodiments.

Referring to FIG. 14, the first removing portion 16a may expose the first region 6 (the first high-concentration region 6a) from one or both of the lower end portion of the inner peripheral wall and the lower end portion of the outer peripheral wall of the first trench 15 in addition to the bottom wall of the first trench 15. Further, the second removing portion 23a may expose the first region 6 (the first high-concentration region 6a) from one or both of the lower end portion of the inner peripheral wall and the lower end portion of the outer peripheral wall of the second trench 22 in addition to the bottom wall of the second trench 22.

Although the embodiments and the modifications have been described above, the above-described embodiments can be implemented in other embodiments. For example, in each of the above-described embodiments, an example in which the trench separation structure 12 partitions the transistor region 11 has been described. However, the device region 10 partitioned by the trench separation structure 12 is not limited to the transistor region 11. That is, the trench separation structure 12 may partition the device region 10 in which at least one of a semiconductor switching device, a semiconductor rectifying device, and a passive device is formed.

In each of the above-described embodiments, the trench separation structure 12 may include a plurality of first trench structures 13. In this case, the plurality of first trench structures 13 may be formed at intervals (for example, the third width W3) so as to surround the device region 10. That is, a plurality of mesa portions 27 may be partitioned by the plurality of first trench structures 13.

The same first potential V1 may be applied to the plurality of first trench structures 13, or a plurality of first potentials V1 set to gradually decrease in the direction away from the device region 10 may be applied to the plurality of first trench structures 13. Further, the same third potential V3 may be applied to the plurality of mesas portions 27, or a plurality of third potentials V3 set to gradually decrease in the direction away from the device region 10 may be applied to the plurality of mesas portions 27.

In each of the above-described embodiments, the trench separation structure 12 may include a plurality of second trench structures 14. In this case, the plurality of second trench structures 14 may be formed in a region between the device region 10 and the first trench structure 13 at intervals (for example, the third width W3) so as to surround the device region 10. That is, the plurality of mesa portions 27 may be partitioned by the plurality of second trench structures 14.

The same second potential V2 may be applied to the plurality of second trench structures 14, or a plurality of second potentials V2, which is set to gradually decrease in the direction away from the device region 10, may be applied to the plurality of second trench structures 14. Further, the same third potential V3 may be applied to the plurality of mesas portions 27, or a plurality of third potentials V3, which is set to gradually decrease in the direction away from the device region 10, may be applied to the plurality of mesas portions 27.

Of course, in each of the above-described embodiments, a plurality of first trench structures 13 and a single second trench structure 14 may be formed. Further, in each of the above-described embodiments, a single first trench structure 13 and a plurality of second trench structures 14 may be formed. Further, in each of the above-described embodiments, a plurality of first trench structures 13 and a plurality of second trench structures 14 may be formed. Even in these cases, the first to third potentials V1 to V3 may be set to gradually decrease in a direction away from the device region 10.

In each of the above-described embodiments, although an example in which the first conduction type is a p type and the second conduction type is an n type has been described, the first conduction type may be an n type and the second conduction type may be a p type. The specific configuration in this case can be obtained by replacing the n-type region with the p-type region and replacing the p-type region with the n-type region in the above description and the accompanying drawings. The "first conduction type" and the "second conduction type" are mere expression forms for clarifying a describing order, and the p type may be expressed as the "second conduction type" and the n type may be expressed as the "first conduction type."

In each of the above-described embodiments, the first direction X and the second direction Y are defined by the extending directions of the first to fourth side surfaces 5A to 5D. However, the first direction X and the second direction Y may be in any direction as long as they maintain the relationship of intersecting (specifically, being orthogonal to) each other.

Feature examples extracted from the present disclosure and the drawings are shown below. In the following description, semiconductor devices capable of improving a withstand voltage are provided. In the following description, the alphanumerical characters in parentheses represent the corresponding constituent elements and the like in the above-described embodiments, but the scope of each item is not intended to be limited to the embodiments.

[A1] A semiconductor device (1A, 1B, 1C) includes: a chip (2) having a first main surface (3) on one side and a second main surface (4) on the other side; a first region (6) of a first conduction type (p-type) which is formed on the second main surface (4) side in the chip (2); a second region (7, 8) of a second conduction type (n-type) which is formed on the first main surface (3) side of the chip (2) and forms a pn-junction portion (9) with the first region (6); a device region (10, 11) which is provided on the first main surface (3); a first groove structure (13) including a first groove (15) which penetrates the pn-junction portion (9) from the first main surface (3), a first insulating film (16) which exposes the first region (6) from the wall surface of the first groove (15), and a first polysilicon (17) which is buried in the first groove (15) with the first insulating film (16) interposed between the first groove (15) and the first polysilicon (17), and partitioning the device region (10, 11); and a second groove structure (14) including a second groove (22) which penetrates the pn-junction portion (9) from the first main surface (3), a second insulating film (23) which exposes the first region (6) from the wall surface of the second groove (22), and a second polysilicon (24) which is buried in the second groove (22) with the second insulating film (23) interposed between the second groove (22) and the second polysilicon (24), and partitioning the device region (10, 11) on the device region (10, 11) side of the first groove structure (13).

[A2] In the semiconductor device (1A, 1B, 1C) of A1, the first polysilicon (17) is connected to the first region (6) and is buried in the first groove (15) with the first insulating film (16) interposed between the first groove (15) and the first polysilicon (17) so as to be electrically insulated from the second region (7, 8), and the second polysilicon (24) is connected to the first region (6) and is buried in the second groove (22) with the second insulating film (23) interposed between the second groove (22) and the second polysilicon (24) so as to be electrically insulated from the second region (7, 8).

[A3] The semiconductor device (1A, 1B, 1C) of A1 or A2, further includes: a first impurity region (31) of the first conduction type (p-type) which is formed inside the first polysilicon (17); and a second impurity region (34) of the first conduction type (p-type) which is formed inside the second polysilicon (24).

[A4] In the semiconductor device (1A, 1B, 1C) of A3, the first impurity region (31) is located within a thickness range between the bottom wall of the first groove (15) and the pn-junction portion (9) so as to be electrically connected to the first region (6), and the second impurity region (34) is located within a thickness range between the bottom wall of the second groove (22) and the pn-junction portion (9) so as to be electrically connected to the first region (6).

[A5] In the semiconductor device (1A, 1B, 1C) of A3 or A4, the second impurity region (34) is formed in a region on the lower end portion side of the second polysilicon (24) at an interval from the upper end portion of the second polysilicon (24) to the lower end portion side thereof.

[A6] In the semiconductor device (1A, 1B, 1C) of any one of A3 to A5, the second impurity region (34) is formed in a region on the lower end portion side of the second polysilicon (24) so as not to cross the depth position of the pn-junction portion (9).

[A7] In the semiconductor device (1A, 1B, 1C) of any one of A3 to A6, the first impurity region (31) is formed inside the first polysilicon (17) so as to cross the depth position of the pn-junction portion (9).

[A8] In the semiconductor device (1A, 1B, 1C) of any one of A3 to A7, the first impurity region (31) is formed in the entire region of the first polysilicon (17).

[A9] The semiconductor device (1A, 1B, 1C) of any one of A3 to A8, further includes: a third impurity region (35) of the second conduction type (n-type) which is formed in a region different from the second impurity region (34) in the second polysilicon (24).

[A10] In the semiconductor device (1A, 1B, 1C) of A9, the third impurity region (35) is formed inside the second polysilicon (24) so as to form a second pn-junction portion (36) with the second impurity region (34).

[A11] In the semiconductor device (1A, 1B, 1C) of A10, the third impurity region (35) forms the second pn-junction portion (36) with the second impurity region (34) in a region on the lower end portion side of the second polysilicon (24) with respect to the depth position of the pn-junction portion (9).

[A12] The semiconductor device (1A, 1B, 1C) of any one of A3 to A8, further includes: a resistance region (102) which is formed in a region different from the second impurity region (34) in the second polysilicon (24) at a concentration lower than the concentration of the second impurity region (34).

[A13] In the semiconductor device (1A, 1B, 1C) of A12, the resistance region (102) is formed inside the second polysilicon (24) at a concentration lower than the concentration of the first impurity region (31).

[A14] In the semiconductor device (1A, 1B, 1C) of A13, the resistance region (102) is formed in a region on the upper end portion side of the second polysilicon (24).

[A15] In the semiconductor device (1A, 1B, 1C) of any one of A12 to A14, the resistance region (102) is formed of an impurity-free region of the second polysilicon.

[A16] In the semiconductor device (1A, 1B, 1C) of any one of A1 to A15, the first groove structure (13) has a first width (W1), and the second groove structure (14) has a second width (W2) less than the first width (W1).

[B1] A semiconductor device (1A, 1B, 1C) includes: a chip (2) having a first main surface (3) on one side and a second main surface (4) on the other side; a first region (6) of a first conduction type (p-type) which is formed on the second main surface (4) side in the chip (2); a second region (7, 8) of a second conduction type (n-type) which is formed on the first main surface (3) side of the chip (2) and forms a pn-junction portion (9) with the first region (6); a device region (10, 11) which is provided on the first main surface (3); a first groove structure (13) including a first groove (15) which penetrates the pn-junction portion (9) from the first main surface (3), a first insulating film (16) which exposes the first region (6) from the wall surface of the first groove (15), and a first polysilicon (17) which is buried in the first groove (15) with the first insulating film (16) interposed between the first groove (15) and the first polysilicon (17), and partitioning the device region (10, 11); a second groove structure (14) including a second groove (22) which penetrates the pn-junction portion (9) from the first main surface (3), a second insulating film (23) which exposes the first region (6) from the wall surface of the second groove (22), and a second polysilicon (24) which is buried in the second groove (22) with the second insulating film (23) interposed between the second groove (22) and the second polysilicon (24), and partitioning the device region (10, 11) on the device region (10, 11) side of the first groove structure (13); a first semiconductor region (31) of the first conduction type (p-type) which is formed inside the first polysilicon (17); and a second semiconductor region (35) of the second conduction type (n-type) which is formed inside the second polysilicon (24).

[B2] In the semiconductor device (1A, 1B, 1C) of B 1, the first semiconductor region (31) is formed inside the first polysilicon (17) so as to cross the depth position of the pn-junction portion (9), and the second semiconductor region (35) is formed inside the second polysilicon (24) so as to cross the depth position of the pn-junction portion (9).

[B3] The semiconductor device (1A, 1B, 1C) of B1 or B2, further includes: a second pn-junction portion (36) which is formed between the first region (6) and the second semiconductor region (35) in the second polysilicon (24).

[B4] In the semiconductor device (1A, 1B, 1C) of B3, the second pn-junction portion (36) is reverse-biased to the pn-junction portion (9).

[B5] In the semiconductor device (1A, 1B, 1C) of B3 or B4, the second pn-junction portion (36) is located in a region on the bottom wall side of the groove (22) with respect to the depth position of the first pn-junction portion (9).

[B6] In the semiconductor device (1A, 1B, 1C) of any one of B1 to B5, the first groove structure (13) has a first width (W1), and the second groove structure (14) has a second width (W2) less than the first width (W1).

[C1] A semiconductor device (1A, 1B, 1C) includes: a chip (2) having a first main surface (3) on one side and a second main surface (4) on the other side; a first region (6) of a first conduction type (p-type) which is formed on the second main surface (4) side in the chip (2); a second region (7, 8) of a second conduction type (n-type) which is formed on the first main surface (3) side of the chip (2) and forms a pn-junction portion (9) with the first region (6); a device region (10, 11) which is provided on the first main surface (3); a first groove structure (13) including a first groove (15), which penetrates the pn-junction portion (9) from the first main surface (3), a first insulating film (16) which exposes the first region (6) from the wall surface of the first groove (15), and a first polysilicon (17) which is buried in the first groove (15) with the first insulating film (16) interposed between the first groove (15) and the first polysilicon (17), and partitioning the device region (10, 11); a second groove structure (14) including a second groove (22), which penetrates the pn-junction portion (9) from the first main surface (3), a second insulating film (23) which exposes the first region (6) from the wall surface of the second groove (22), and a second polysilicon (24), which is buried in the second groove (22) with the second insulating film (23) interposed between the second groove (22) and the second polysilicon, and portioning the device region (10, 11) on the device region (10, 11) side of the first groove structure (13); a first semiconductor region (31) of the first conduction type (p-type) which is formed inside the first polysilicon (17); and a resistance region (102) which is formed inside the second polysilicon (24) at a concentration lower than the concentration of the first semiconductor region (31).

[C2] In the semiconductor device (1A, 1B, 1C) of C1, the first semiconductor region (31) is formed inside the first polysilicon (17) so as to cross the depth position of the pn-junction portion (9), and the resistance region (102) is formed inside the second polysilicon (24) so as to cross the depth position of the pn-junction portion (9).

[C3] In the semiconductor device (1A, 1B, 1C) of C1 or C2, the resistance region (102) is formed of an impurity-free region of the second polysilicon (24).

[C4] In the semiconductor device (1A, 1B, 1C) of any one of C1 to C3, the first groove structure (13) has a first width (W1), and the second groove structure (14) has a second width (W2) less than the first width (W1).

[D1] A semiconductor device (1A, 1B, 1C) Includes: a chip (2) having a main surface (3); a first pn-junction portion (9) which is formed inside the chip (2) so as to extend along the main surface (3); a device region (10, 11) which is provided on the main surface (3); a groove structure (14) including a groove (22), which penetrates the first pn-junction portion (9) from the main surface (3), an insulating film (23) which exposes the bottom wall of the groove (22) in the groove (22), and a polysilicon (24) which is buried in the groove (22) with the insulating film (23) interposed between the groove (22) and the polysilicon (24), and partitioning the device region (10, 11) from other regions; and a second pn-junction portion (36) which is formed inside the polysilicon (24).

[D2] In the semiconductor device (1A, 1B, 1C) of D1, the second pn-junction portion (36) is reverse-biased to the first pn-junction portion via the bottom wall of the groove (22).

[D3] In the semiconductor device (1A, 1B, 1C) of D1 or D2, the second pn-junction portion (36) is located in a region on the bottom wall side of the groove (22) with respect to the depth position of the first pn-junction portion (9).

[D4] In the semiconductor device (1A, 1B, 1C) of any one of D1 to D3, a distance from the first pn-junction portion (9) to the bottom wall of the groove structure (14) is larger than a distance from the first pn-junction portion (9) to the main surface (3).

[E1] A semiconductor device (1A, 1B, 1C) includes: a chip (2) having a main surface (3); a first pn-junction portion (9) which is formed inside the chip (2) so as to extend along the main surface (3); a device region (10, 11) which is provided on the main surface (3); a groove structure (14) including a groove (22) which penetrates the first pn-junction portion (9) from the main surface (3), an insulating film (23) which exposes the bottom wall of the groove (22) in the groove (22), and a polysilicon (24) which is buried in the groove (22) with the insulating film (23) interposed between the groove (22) and the polysilicon (24), and partitioning the device region (10, 11) from other regions; and an impurity-free resistance region (102) which is formed inside the polysilicon (24).

[E2] In the semiconductor device (1A, 1B, 1C) of E1, the resistance region (102) is formed inside the polysilicon (24) so as to cross the depth position of the pn-junction portion (9).

[E3] In the semiconductor device (1A, 1B, 1C) of E1 or E2, a distance from the pn-junction portion (9) to the bottom wall of the groove structure (14) is larger than a distance from the pn-junction portion (9) to the main surface (3).

Although the embodiments have been described in detail, these are merely specific examples used to clarify the technical contents, and the present disclosure should not be construed as being limited to these specific examples and the scope of the present disclosure is limited by the attached claims.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor device comprising:
   a chip having a first main surface on one side and a second main surface on another side;
   a first region of a first conduction type which is formed down to the second main surface in the chip;
   a second region of a second conduction type which is formed below the first main surface of the chip and forms a first pn-junction portion with the first region;
   a device region which is provided on the first main surface;
   a first groove structure including a first groove which penetrates the first pn-junction portion from the first main surface, a first insulating film which is formed on a part of a wall surface of the first groove and exposes the first region from another part of the wall surface on which the first insulating film is not formed, and a first polysilicon which is buried in the first groove with the first insulating film interposed between the first groove and the first polysilicon, and partitioning the device region;
   a second groove structure including a second groove which penetrates the first pn-junction portion from the first main surface, a second insulating film which exposes the first region from a wall surface of the second groove, and a second polysilicon which is buried in the second groove with the second insulating film interposed between the second groove and the second polysilicon, and partitioning the device region on a device region side of the first groove structure;
   a first impurity region of the first conduction type which is formed inside the first polysilicon; and
   a second impurity region of the first conduction type which is formed inside the second polysilicon; and
   a third impurity region of the second conduction type which is formed in a region different from the second impurity region in the second polysilicon,
   wherein the third impurity region is formed inside the second polysilicon so as to form a second pn-junction portion with the second impurity region.

2. The semiconductor device of claim 1, wherein the first polysilicon is connected to the first region and is buried in the first groove with the first insulating film interposed between the first groove and the first polysilicon so as to electrically insulate the first polysilicon from the second region, and
   wherein the second polysilicon is connected to the first region and is buried in the second groove with the second insulating film interposed between the second groove and the second polysilicon so as to electrically insulate the second polysilicon from the second region.

3. The semiconductor device of claim 1, wherein the first impurity region is located within a thickness range between a bottom wall of the first groove and the first pn-junction portion so as to be electrically connected to the first region, and
   wherein the second impurity region is located within a thickness range between a bottom wall of the second groove and the first pn-junction portion so as to be electrically connected to the first region.

4. The semiconductor device of claim 1, wherein the second impurity region is formed in a region on a lower end portion side of the second polysilicon at an interval from an upper end portion of the second polysilicon to the lower end portion side of the second polysilicon.

5. The semiconductor device of claim 1, wherein the second impurity region is formed in a region on a lower end portion side of the second polysilicon so as not to cross a depth position of the first pn-junction portion.

6. The semiconductor device of claim 1, wherein the first impurity region is formed inside the first polysilicon so as to cross a depth position of the first pn-junction portion.

7. The semiconductor device of claim 1, wherein the first impurity region is formed in an entire region of the first polysilicon.

8. The semiconductor device of claim 1, wherein the third impurity region forms the second pn-junction portion with the second impurity region in a region on a lower end portion side of the second polysilicon with respect to a depth position of the first pn-junction portion.

9. The semiconductor device of claim 1, further comprising: a resistance region which is formed in a region different from the second impurity region in the second polysilicon at a concentration lower than a concentration of the second impurity region.

10. The semiconductor device of claim 9, wherein the resistance region is formed inside the second polysilicon at a concentration lower than a concentration of the first impurity region.

11. The semiconductor device of claim 10, wherein the resistance region is formed in a region on an upper end portion side of the second polysilicon.

12. The semiconductor device of claim 9, wherein the resistance region is formed of an impurity-free region of the second polysilicon.

13. The semiconductor device of claim 1, wherein the first groove structure has a first width, and
    wherein the second groove structure has a second width less than the first width.

14. A semiconductor device comprising:
    a chip having a main surface;
    a first pn-junction portion which is formed inside the chip so as to extend along the main surface;
    a device region which is provided on the main surface;

a groove structure including a groove which penetrates the first pn-junction portion from the main surface, an insulating film which is formed on a side wall of the groove and exposes a bottom wall of the groove in the groove, and a polysilicon which is buried in the groove with the insulating film interposed between the groove and the polysilicon, and partitioning the device region from other regions;

a second pn-junction portion which is formed inside the polysilicon; and a groove insulation structure including:
  a shallow groove which is interposed between the main surface and the side wall of the groove and exposes the insulating film and the polysilicon; and
  an insulator which is buried in the shallow groove.

15. The semiconductor device of claim 14, wherein the second pn-junction portion is reverse-biased to the first pn-junction portion via the bottom wall of the groove.

16. The semiconductor device of claim 14, wherein the second pn-junction portion is located in a region on a bottom wall side of the groove with respect to a depth position of the first pn-junction portion.

17. The semiconductor device of claim 14, wherein a distance from the first pn-junction portion to a bottom wall of the groove structure is larger than a distance from the first pn-junction portion to the main surface.

\* \* \* \* \*